(12) United States Patent
Takahashi

(10) Patent No.: US 7,847,345 B2
(45) Date of Patent: Dec. 7, 2010

(54) INSULATED GATE SEMICONDUCTOR DEVICE AND METHOD FOR MANUFACTURING THE SAME

(75) Inventor: Hideki Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 603 days.

(21) Appl. No.: 11/670,136

(22) Filed: Feb. 1, 2007

(65) Prior Publication Data
US 2008/0048295 A1 Feb. 28, 2008

(30) Foreign Application Priority Data
Aug. 28, 2006 (JP) .............................. 2006-231124

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ....................................... 257/330; 257/332
(58) Field of Classification Search ......... 257/327–346, 257/E29.183, E29.262
See application file for complete search history.

(56) References Cited
U.S. PATENT DOCUMENTS
5,702,961 A 12/1997 Park 6,069,371 A 5/2000 Omura et al.
2005/0045960 A1* 3/2005 Takahashi .................... 257/368
2005/0073030 A1 4/2005 Inoue et al.
2007/0069287 A1 3/2007 Takahashi FOREIGN PATENT DOCUMENTS
| CN | 1505173 A | 6/2004 |
| CN | 1591902 A | 3/2005 |
| DE | 10 2004 035 788 A1 | 3/2005 |
| DE | 10 2004 040 997 A1 | 3/2005 |
| DE | 10 2006 049 212 A1 | 5/2007 |
| JP | 11-274516 | 10/1999 |
| JP | 2005-101514 | 4/2005 |

OTHER PUBLICATIONS
U.S. Appl. No. 12/099,599, filed Apr. 8, 2002, Takahashi, et al.

* cited by examiner

*Primary Examiner*—Cuong Q Nguyen
(74) *Attorney, Agent, or Firm*—Oblon, Spivak, McClelland, Maier & Neustadt, L.L.P.

(57) ABSTRACT

There is provided a structure wherein an emitter layer 3 is provided in the region A on the first major surface side of a semiconductor substrate 1, and emitter layer 3 is not provided in the region b. There is provided a structure wherein a collector P layer 5 is provided in the region A on the second major surface side of a semiconductor substrate 1, and a cathode N layer 4 is provided in the region B. Specifically, there is provided a structure wherein IGBTs are composed in the region A, and diodes are composed in the region B. By the above-described structure, ON characteristics when the gate is turned on can be improved while suppressing the elevation of the forward voltage Vf and the recovery current of the diodes.

9 Claims, 21 Drawing Sheets

IGBT and FWD are separately fabricated

INSULATED GATE SEMICONDUCTOR DEVICE AND METHOD FOR MANUFACTURING THE SAME

BACKGROUND OF THE INVENTION

1. Field of the Invention

The present invention relates to an insulated gate semiconductor device and a method for manufacturing the same, and more specifically to an insulated gate bipolar transistor having a built-in diode and a method for manufacturing the same.

2. Background Art

In power electronics for driving motors or the like, an insulated gate bipolar transistor (IGBT) is used as a switching element in the region wherein the rated voltage is 300 V or higher. Normally, a reflux diode is connected to the IGBT in parallel.

FIG. 35 shows the cross-sectional structure of a conventional IGBT. An N+ buffer layer 112 is formed on a collector P layer 5, and an N− layer 1 is formed thereon. On the surface of the N− layer 1, a P base layer 2 wherein a p-type impurity is diffused is selectively formed. On the surface of the P base layer 2, an emitter layer 3 wherein an n-type impurity of a high concentration is selectively diffused is formed. Trenches from the emitter layer 3 to the N− layer 1 are formed; oxide films 7 are formed on the inner walls of the trenches; and gate electrodes 8 composed of polysilicon are formed therein. In the P base layer 2 between the emitter layer 3 and the N− layer 1, a channel along the above-described trenches is formed. An emitter electrode 11 is formed on a part of the region on the surface of the emitter layer 3 and on the region on the surface of the P base layer 2, and a collector electrode 12 is formed on the back face side of the collector P layer 5.

Next, the operation of the IGBT shown in FIG. 35 will be described. First in the structure of FIG. 35, a predetermined collector voltage $V_{CE}$ is supplied between the emitter electrode 11 and the collector electrode 12, and a predetermined gate voltage $V_{GE}$ is supplied between the emitter electrode 11 and the gate electrode 8 to turn the gate on. When the gate is turned on, the channel region is reversed to the n-type, and a channel is formed. Through this channel, electrons are injected into the N− layer 1 from the emitter electrode 11. By the injected electrons, the N+ buffer layer 112 between the collector P layer 5 and the N− layer 1 is forward-biased, and holes are injected into the N− layer 1 from the collector P layer 5. Then, the resistance of the N− layer 1 is significantly lowered, and the current capacity of the IGBT is elevated. As described above, by the injection of holes from the collector P layer 5, the resistance of the N− layer 1 is lowered.

Next, the operation of the IGBT from the on-state to the off-state will be described. In the structure of FIG. 35, the gate voltage $V_{GE}$ supplied between the emitter electrode 11 and the gate electrode 8 in the on-state is made zero or reverse bias to turn the gate off. When the gate is turned off, the channel region reversed to the n-type returns to a P region, and the injection of electrons from the emitter electrode 11 is stopped. Thereby, the injection of holes from the collector P layer 5 is also stopped. Thereafter, electrons and holes having accumulated in the N− layer 1 (N+ buffer layer 112) escape to the collector electrode 12 and the emitter electrode 11, respectively, or recombine to each other and disappear (e.g., refer to Japanese Patent Application Laid-Open No. 2005-101514)

SUMMARY OF THE INVENTION

FIG. 36 shows a sectional view in the vicinity of a unit cell of the IGBT invented by the present inventors for improving the characteristics of the above-described IGBT. As FIG. 36 shows, an N layer 4 is formed between the P base layer 2 and the N− layer 1. Other configurations are the same as in FIG. 35.

The operation of the IGBT shown in FIG. 36 is basically the same as the operation of the IGBT shown in FIG. 35. However, since the N layer 4 is formed between the P base layer 2 and the N− layer 1, holes injected from the collector P layer 5 when the IGBT is in on-operation are difficult to escape to the P base layer 2 because the N layer 4 acts as a barrier. Therefore, since carriers accumulate in the vicinity of the N layer 4, the on-voltage of the IGBT is lowered. When the IGBT is in the off state, since the N layer 4 is depleted by the collector voltage, the effect of the N layer 4 disappears.

FIG. 37 is a sectional view showing the basic structure of a diode provided in parallel to the IGBT. As the sectional view shows, on the surface of a substrate composed on the N− layer 1, a P region 2 to be an anode is formed, and an anode electrode 111 is further formed thereon. On the back face of the substrate, an N+ cathode layer 4 and a cathode electrode 112 are formed.

The operation of a diode having such a structure will be described. A predetermined anode voltage VAK (forward bias) is supplied between the anode electrode 111 and the N− layer 1. When the anode voltage exceeds the built-in potential of the P-N junction, forward bias is supplied between the P region 2 and the N− layer 1 of the anode, and the diode becomes conducting. When a reverse bias is supplied, a depletion layer extends from the P region 2 of the anode, and the with stand voltage in the inverse direction can be maintained.

FIG. 38 shows a current waveform in inverse recovery when the diode shown in FIG. 37 is switched from the ON state to the OFF state. When the diode is switched from the ON state to the OFF state, current flows in the inverse direction current instantaneously flows from the N side toward the P side. The peak value of the current in the inverse direction is referred to as the recovery current (Irr). A diode having a low-gradient current when the current value returns from Irr to zero is referred to as a soft-recovery diode.

Although not shown in the drawing, since a source voltage is supplied to the diode in the above-described inverse recovery, the product of the voltage and the current becomes the recovery loss. As a rectifier diode, it is generally required to use a soft-recovery diode having a low steady loss (Vf) in the ON state and a low recovery loss in inverse recovery, wherein the recovery of the current in inverse recovery is slow.

FIG. 39 shows the configuration of an ordinary inverter circuit using the above-described IGBT. An inverter circuit is a circuit to invert a direct current to an alternate current, and is composed of IGBTs, which are switching elements, and free wheel diodes. In an inverter circuit used for the control of a motor, four or six IGBTs and four or six diodes. In this inverter circuit, DC terminals are connected to a DC power source, and a DC current is inverted to an AC current by switching the IGBTs and the AC current is supplied to a motor, which is a load.

As described above, in an ordinary inverter circuit using the above-described IGBT, free wheel diodes must be connected in inversely parallel so as to form pairs with IGBTs. Therefore, a structure wherein a diode is incorporated in an IGBT used in an inverter circuit has been heretofore proposed.

The present inventors proposed a structure wherein a free wheel diode is incorporated in an IGBT in the International Symposium on Power Semiconductor Devices and ICs 04 (ISPSD '04).

FIG. 40 is a three-dimensional sectional view of the above-described structure, and the vicinity of the surface is the same as in the structure shown in FIG. 36. On the back face side, a structure having built-in diodes is formed by separately forming a stripe-shaped collector P layer 5 and a stripe-shaped cathode N layer 4 perpendicularly to the orientation of the cell on the surface side.

When a device having the above-described structure was experimentally fabricated and compared with a device wherein IGBTs and diodes were separately fabricated, the ON characteristics of the IGBTs were deteriorated. When the gate was turned on, the forward voltage Vf of the diodes was elevated. Furthermore, in the recovery characteristics of the diodes, a significantly large recovery current was observed.

As the cause of these results, the inventors considered as follows: Firstly, the reason why the ON characteristics of the above-described structure were deteriorated was that the conducting regions were simply decreased by incorporation a diode in an IGBT.

A diode of this structure is turned on when the potentials of the P base layer and the N layer exceed the built-in potential of the P-N junction, and the N⁻ layer (N layer) is electrically connected to the N⁺ layer of the emitter. Since the N⁺ layer has a common contact with the P base layer, by turning the gate on, a voltage becomes difficult to supply to the P-N junction between the P base layer and the N layer. Therefore, the present inventors considered that the injection of holes from the P base layer became difficult, and Vf was elevated.

In a diode recently used, to improve the recovery characteristics, a structure wherein the anode P layer of the diode has low concentration and shallow diffusion depth has been adopted. In the structure of the present invention, the same structure is used in the P base layer of an IGBT and in the anode P layer of the diode. Since the P base layer of the IGBT determined the threshold voltage, it has higher concentration compared with the structure using only diodes. Therefore, the present inventors considered that the carrier density in the vicinity of the surface was raised when the diode was turned on, and the recovery current was enlarged.

In order to suppress the above-described elevation of the forward voltage Vf of the diode, the present inventors devised a structure shown in FIG. 41. In this structure, emitter layers 3 of insulated transistors are formed between the trenches 6a and 6b, and the trenches 6c and 6d of IGBA region A. On the other hand, no emitter layers 3 are formed between the trenches 6b and 6c in the diode region B. In this structure, it was intended that the IGBT region A be operated as IGBTs, and the diode region B be operated as diodes.

However, by the above-described structure, since the region where IGBTs are formed is only the space between the above-described pair of trenches, the diode region cannot be sufficiently enlarged. Therefore, even if the gate was turned on, the elevation of the forward voltage Vf of the diode could not be suppressed. Also in this structure, the ON characteristics were deteriorated compared with the case wherein IGBTs and diodes were separately fabricated.

To solve the above-described problems, it is an object of the present invention to improve the ON characteristics while suppressing the elevation of the forward voltage Vf and the recovery current of the diodes when the gate of an insulated gate semiconductor device is turned on.

According to one aspect of the present invention, an insulated gate semiconductor device has a semiconductor substrate of a first conductivity type having a first major surface and a second major surface, a first semiconductor layer of a second conductivity type provided in the vicinity of the first major surface of at least one first region of the semiconductor substrate and at least one second region adjacent to the first region, a plurality of first trenches provided in each region of the first region and penetrating the first semiconductor layer from the first major surface of the semiconductor substrate, a second semiconductor layer of a first conductivity type selectively provided in the vicinity of the first trenches on the first major surface side of the semiconductor substrate, and in the first semiconductor layer of the first region, an insulating film coating the inner surfaces of the first trenches, a conductive film buried in the first trenches through the insulating film, a first major electrode provided on the first semiconductor layer and the second semiconductor layer, and electrically connected to these layers, a third semiconductor layer provided on the second major surface of the semiconductor substrate, a fourth semiconductor layer provided on the second major surface of the semiconductor substrate, and a second major electrode coating the third semiconductor layer and the fourth semiconductor layer, and provided on the second major surface of the semiconductor substrate.

According to the present invention, the ON characteristics can be improved while suppressing the elevation of the forward voltage Vf and the recovery current of the diodes when the gate of an insulated gate semiconductor device is turned on.

Other and further objects, features and advantages of the invention will appear more fully from the following description.

DETAILED DESCRIPTION OF THE PREFERRED EMBODIMENTS

Figure 1:
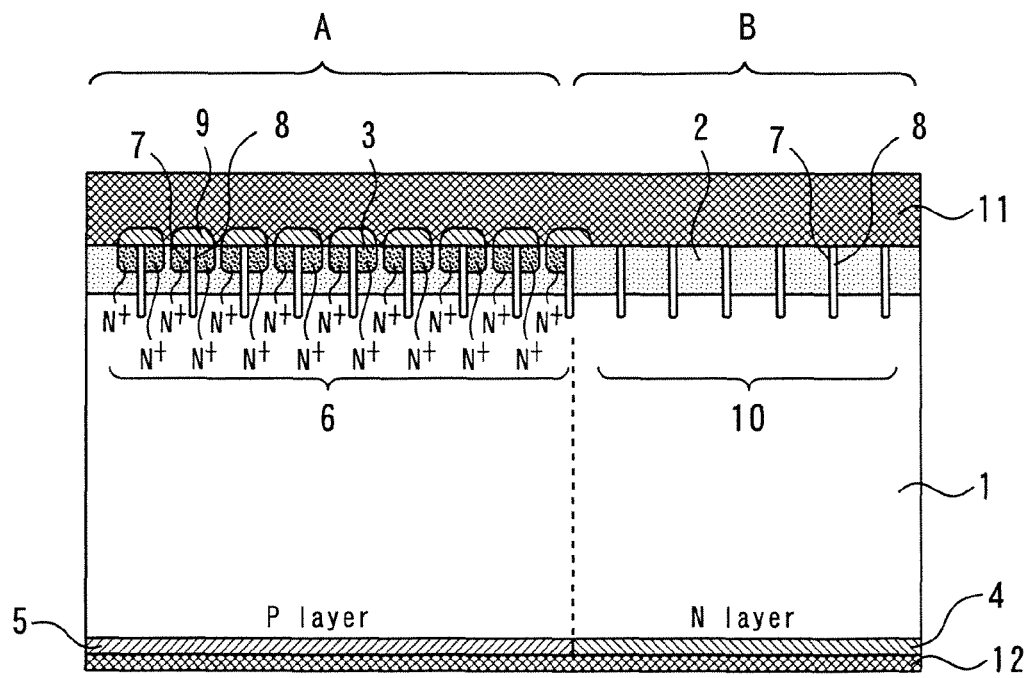
FIGS. 1-3 are sectional views of an insulated gate semiconductor device according to the first embodiment of the present invention.

The embodiments of the present invention will be described below referring to the drawings. In these drawings, the same or corresponding parts will be denoted by the same characters and numerals, and the description thereof will be simplified or omitted.

First Embodiment

FIG. 1 is a sectional view of an insulated gate semiconductor device according to the first embodiment of the present invention. The semiconductor device is formed using an N⁻ substrate 1 containing an n-type impurity, and the N⁻ substrate 1 has a first major surface (upper major surface) and a second major surface (lower major surface). The N⁻ substrate 1 has at least one region A (first region), and a region B (second region) is provided so as adjoin thereto. Emitter layers 3 are provided in the region A, but no emitter layers 3 are provided in the region B.

Figure 2:
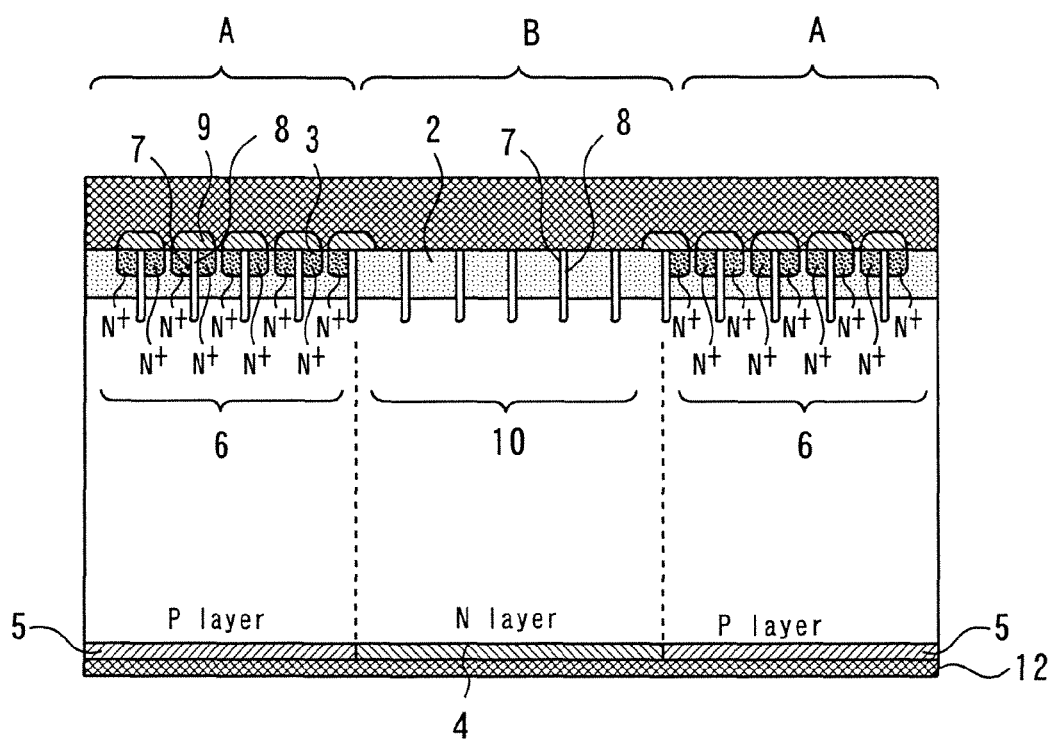

In the region A and the region B, a P base layer 2 wherein a p-type impurity is diffused is selectively provided in the vicinity of the first major surface side of the N⁻ substrate 1. In the region A, a plurality of first trenches 6 are provided at intervals of about 2 to 10 μm so as to penetrate the P base layer 2 from the first major surface side of the N⁻ substrate 1. (As FIG. 2 shows, when a plurality of regions A are provided on the N⁻ substrate 1, a plurality of first trenches 6 are provided in each of the regions A.) In the region A, emitter layers 3 are selectively provided as n-type second semiconductor layers on the vicinity of the first trenches 6 in the P base layer 2 on the first major surface side of the N⁻ substrate 1. Into the emitter layers 3, an n-type impurity of a high concentration is diffused. On the emitter layers 3, an interlayer film 9 is provided.

On the surfaces of both end portions of the emitter layers 3 and on the surface of the P base layer 2, an emitter layer 11 is provided as a first major electrode, and is electrically connected to these layers. A gate insulating film 7 is formed so as to coat the inner surfaces of the first trenches 6. In the first trenches 6, conductive films 8 composed of polysilicon are buried through the gate insulating film 7.

The conductive films 8 in the region A function as the gate electrodes of an insulated gate bipolar transistor (hereafter referred to as "IGBT"). When the gate of the IGBT is turned on, a channel region (not shown) is formed along the gate insulating film 7 in the P base layer 2.

Figure 3:
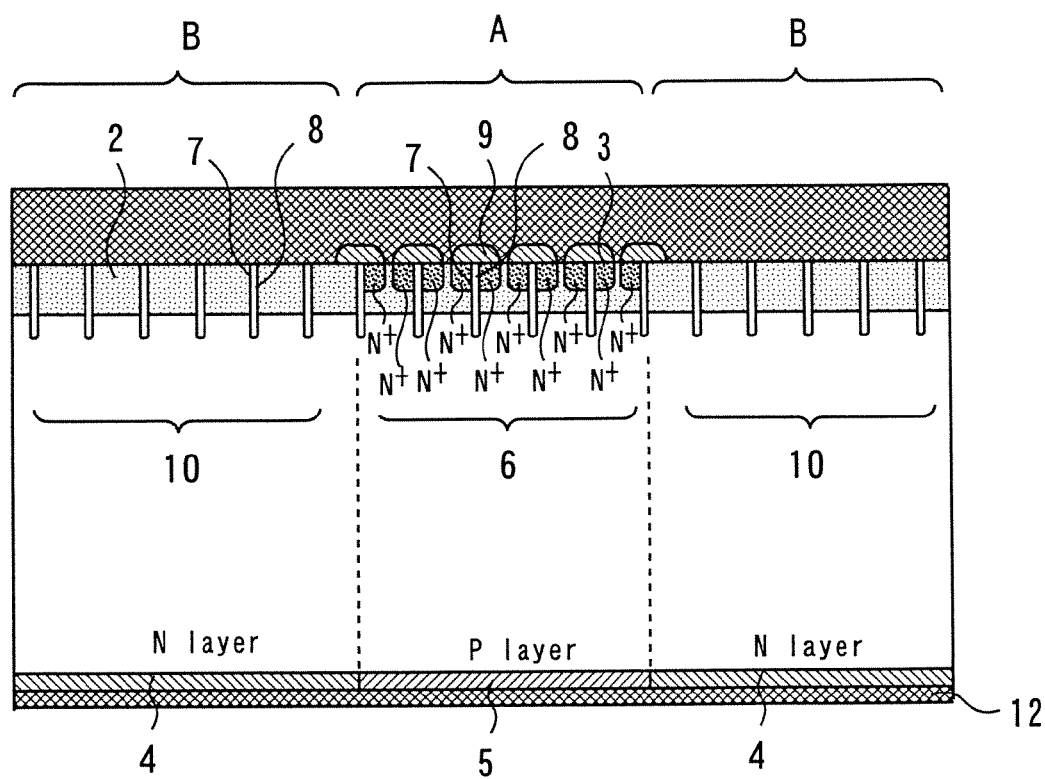

In the region B, a plurality of second trenches 10 are provided at an interval of about 2 to 10 μm so as to penetrate the P base layer 2 from the first major surface of the N⁻ substrate 1. (As FIG. 3 shows, when a plurality of regions B are provided on the N⁻ substrate 1, a plurality of second trenches 10 are provided in each of the regions B.) A gate insulating film 7 is formed so as to coat the inner surface of the second trenches 10. In the second trenches 10, conductive films 8 composed of polysilicon are buried through the gate insulating film 7. The conductive films 8 are electrically connected to the emitter electrode 11.

In the above-described structure, the insulating film 7 provided on the inner surface of the second trenches 10 is formed of the same material as the insulating film 7 provided in the first trenches 6. The conductive films 8 buried in the second trenches 10 are formed of the same material as the conductive films 8 buried in the first trenches 6. Thereby, the formation of the insulated gate semiconductor device is facilitated. If the interval of the first trenches 6 and the interval of the second trenches 10 is larger than 10 μm, electric fields are concentrated on the end portions of the trenches, and the withstand voltage of the gate insulating film is deteriorated. In the first embodiment, the interval of the first trenches 6 and the interval of the second trenches 10 is 2 to 10 μm. Thereby, the above-described deterioration of the withstand voltage can be suppressed.

In the vicinity of back face (second major surface) of the N⁻ substrate 1 in the region A, a collector P layer 5 containing a p-type impurity is provided as a third semiconductor layer. In the vicinity of back face of the N⁻ substrate 1 in the region B, a cathode N layer 4 containing an n-type impurity is provided as a fourth semiconductor layer. Also on the back face of the N⁻ substrate 1, a collector electrode 12 is provided so as to coat the collector P layer 5 and the cathode N layer 4, and electrically connected to these layers.

Next, the operation of the IGBT shown in FIG. 1 will be described. First, a predetermined collector voltage $V_{CE}$ is supplied between the emitter electrode 11 and the collector electrode 12, and a predetermined gate voltage $V_{GE}$ is supplied between the emitter electrode 11 and the conductive film (gate electrode) 8 to turn the gate on.

Then, the above-described channel region in reversed to the n-type, and a channel is formed. Through this channel, electrons are injected from the emitter electrode 11 into the N⁻ substrate 1. Thereby, forward bias is applied between the collector P layer 5 and the N⁻ substrate 1. Then, holes are injected from the collector P layer 5, the resistance of the N⁻ substrate 1 is significantly lowered, and the current capacity of the IGBT is elevated.

Figure 40:
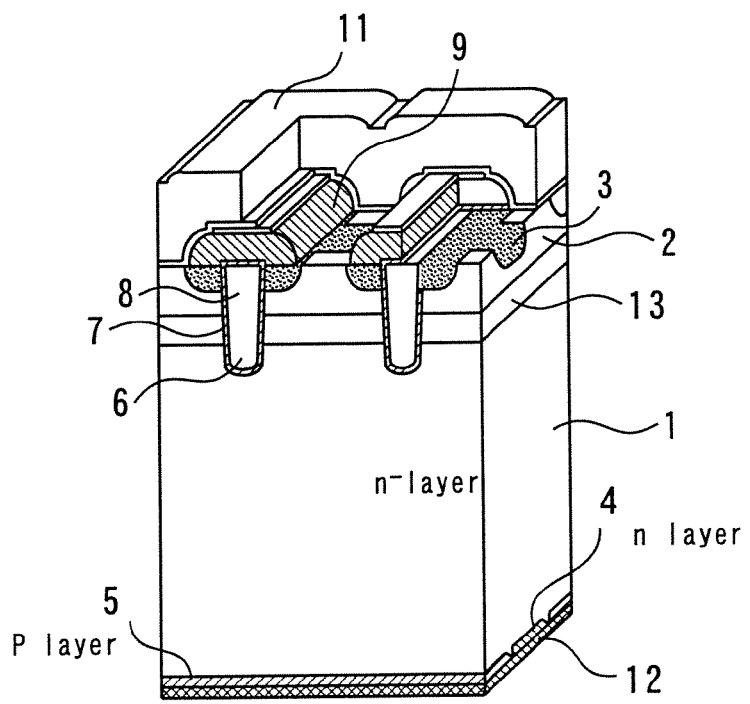
FIG. 40 is a three-dimensional sectional view of the above-described structure, and the vicinity of the surface is the same as in the structure shown in FIG. 36.
Figure 41:
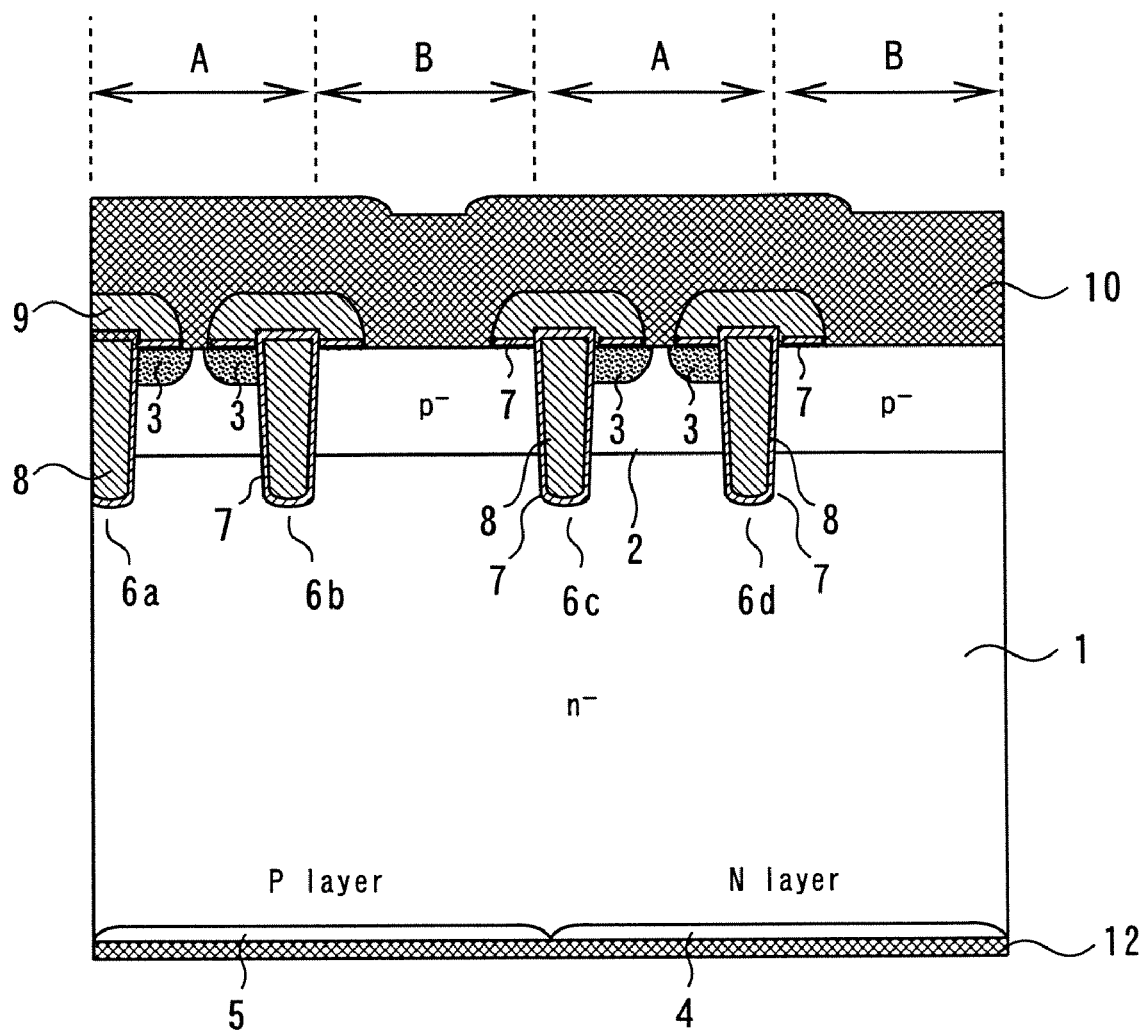
FIG. 41 shows a sectional view of an insulated gate semiconductor device invented by the present inventors.

In the cross-section shown in FIG. 1, the IGBT on the surface of the N⁻ substrate 1 and the collector P layer 5 on the back face of the N⁻ substrate 1 are formed in the region A. Therefore, the above-described current flows linearly from the back face of the N⁻ substrate 1 toward the surface of the N⁻ substrate 1 in the direction perpendicular to the first major surface of the N⁻ substrate 1. Therefore, it is considered that the steady loss of the IGBT can be lowered compared with the conventional structure shown in FIG. 40.

Next, the ON state of the diode will be described. In the structure of FIG. 1, the region B wherein no emitter has been formed mainly operates as a diode. When a positive voltage is supplied to the emitter electrode 11 side, the diode formed of the cathode N layer 4 and the P base layer 2 in the region B is turned on, and a current flows.

Also in the case of this diode, when viewed from the first major surface side of the N⁻ substrate 1, the P base layer 2 and the cathode N layer 4 are formed in the same location. Therefore, the above-described current flows linearly from the surface of the N⁻ substrate 1 toward the back face of the N⁻ substrate 1 in the direction perpendicular to the major surface of the N⁻ substrate 1. Thereby, it is considered that the steady loss Vf of the diode can be lowered compared with the structure shown in FIG. 40.

Furthermore, although the validation of simulation will be described later, in the structure shown in FIG. 1, the region A where the cell of the IGBT is formed and the region B where no emitter is formed are separately disposed on the surface of the N⁻ substrate 1 in a broad view. By such separate disposal in a broad view, $V_{CE}$ (sat) and Vf can also be reduced. Specifically, the On-characteristics of the gate can be improved, and the Vf of the diode can be lowered.

Here, when the gate of the IGBT is turned on in the region A, the N⁻ substrate 1 is connected to the emitter layer 3 through the channel. By the emitter electrode 11, the emitter layer 3 and the P base layer 2 are fixed at the same potential. Specifically, since the potential of the P base layer 2 is the same as the potential of the N⁻ substrate 1, the diode operation becomes difficult to occur between the P base layer 2 and the N⁻ substrate 1.

Whereas in the region B where no emitter layer is formed, since no channel is formed even if the gate is turned on, the potential of the P base layer 2 is not the same as the potential of the N⁻ substrate 1. Therefore, by widening the region B, the elevation of the Vf of the diode when the gate is turned on can be suppressed.

In the first embodiment, a plurality of second trenches 10 are formed in the region B shown in FIG. 1 to secure the width of the region B to be a predetermined value or more. Thereby, compared with the structure shown in FIG. 40, the elevation of the Vf of the diode when the gate is turned on can be suppressed.

Next, the results of simulation for the structure shown in FIG. 1 will be described.

Figure 4:
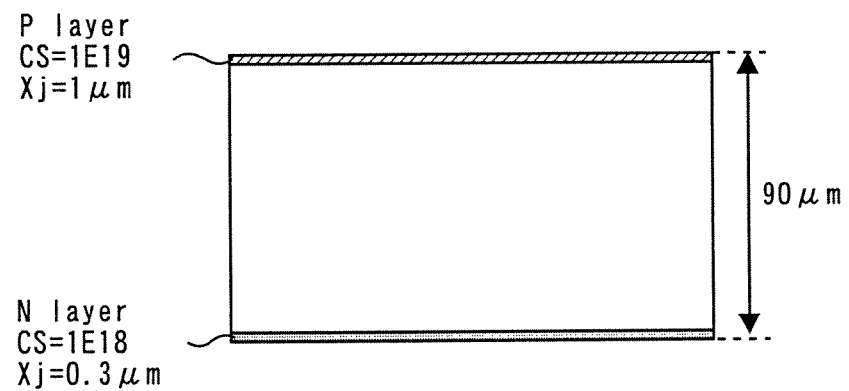
FIGS. 4-6 are sectional views for explaining simulation.

First, as FIG. 4 shows, the thickness and the width of the silicon wafer were assumed as 90 μm and 100 μm, respectively, a P layer of a high concentration having a thickness of 1 μm was formed on the surface side of the wafer, an N layer of a high concentration having a thickness of 0.3 μm was formed on the back face side of the wafer, and the Vf of the diode was measured.

Figure 5:
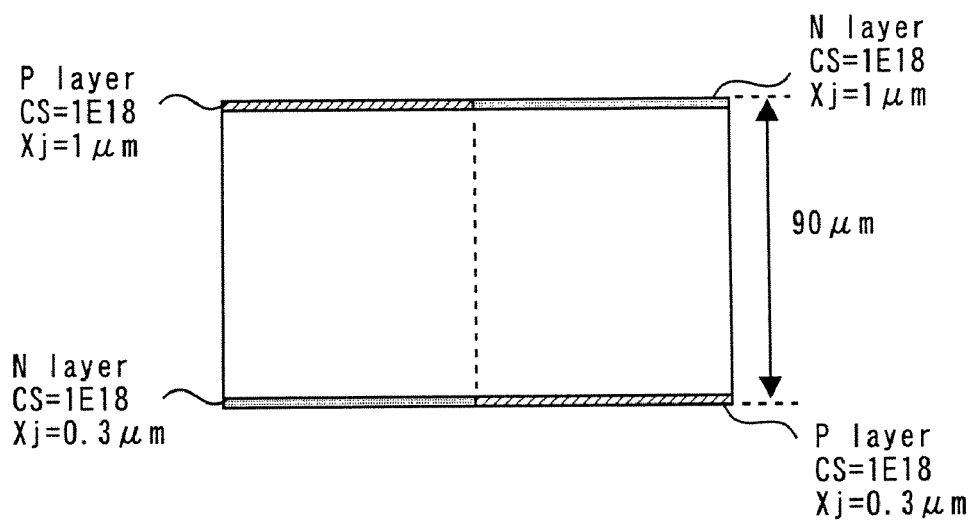
Figure 6:
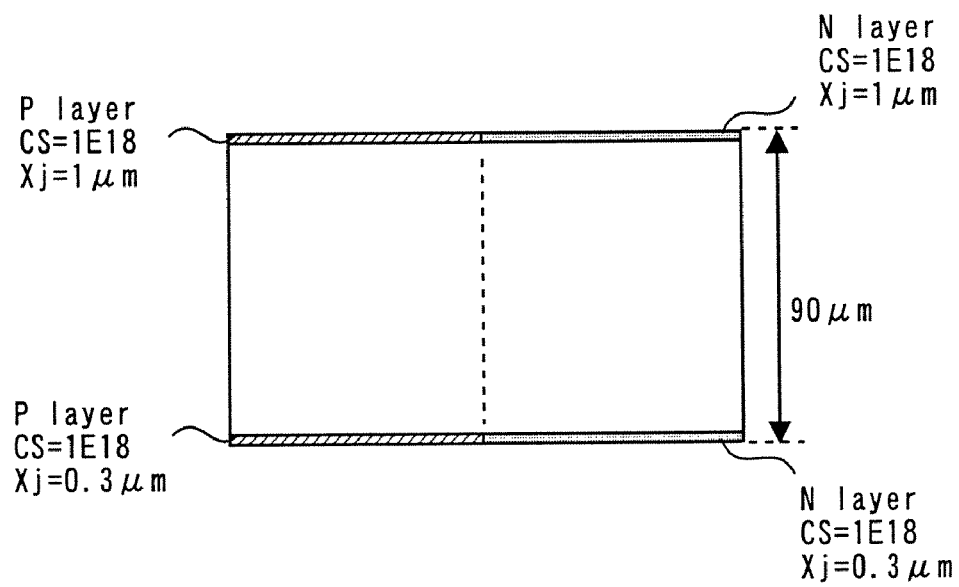

Next, as FIG. 5 shows, P layers and N layers each having a width of 100 μm were formed on the surfaces of the wafer, and simulation was conducted for the case wherein an N layer and a P layer were formed immediately below a P layer and an N layer, respectively, and the case wherein an N layer and a P layer were formed immediately below the N layer and the P layer, respectively as FIG. 6 shows.

Figure 7:
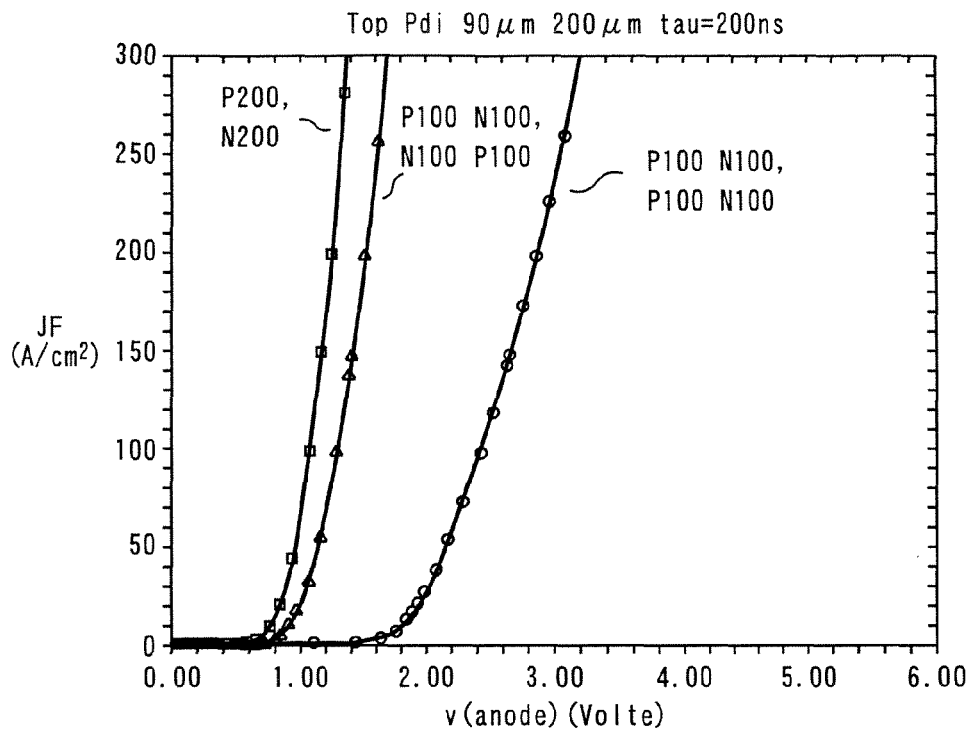
FIGS. 7 and 8 show the results of the simulation.

FIG. 7 shows the result of the simulation. It is seen from FIG. 7 that when a P layer and an N layer were formed immediately below another P layer and another N layer, respectively, the Vf of the diode was extremely large. Whereas, when an N layer and a P layer were formed immediately below another P layer and another N layer, respectively, the result was substantially the same as in the structure shown in FIG. 4 wherein only the diode was formed.

In this simulation, it is assumed that the N layer on the surface of the silicon wafer corresponds to the IGBT region, and the P layer corresponds to the anode P layer of the diode. The above-described result of simulation shows that the formation of a P layer immediately below the IGBT region, and an N layer immediately below the anode P layer of the diode is effective for the improvement of the characteristics.

Figure 8:
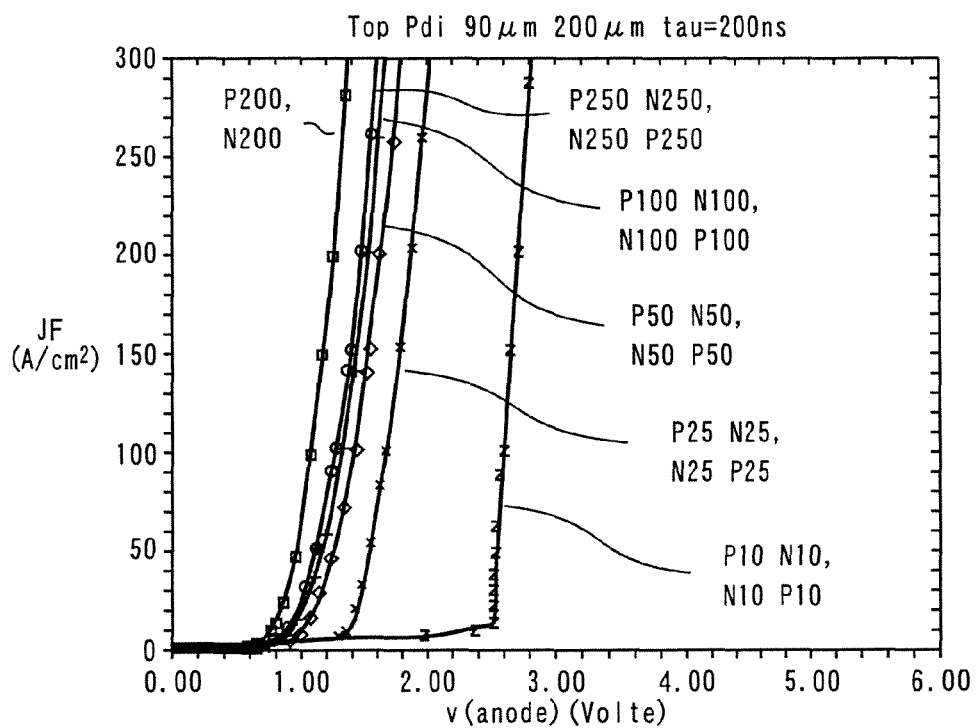

Next, FIG. 8 shows the result of simulation for the structure wherein the N layer was formed immediately below the P layer and the other P layer was formed immediately below the other N layer shown in FIG. 5 by varying the widths of the P layer and the N layer. In this simulation, since the boundary conditions of the edge surface are folded back, the values twice the widths of the P layer and the N layer (the values noted in the right side of P and N) shown in FIG. 8 correspond to the actual widths.

It is seen from FIG. 8 that when the actual widths of the P layer and the N layer are 20 μm (the case of P10 N10, N10 P10 in FIG. 8), the value of Vf is larger than the value in the structure shown in FIG. 4 (P200, N200 in FIG. 8). When the actual widths of the P layer and the N layer is 50 μm, (P25 N25, N25 P25 in FIG. 8), the value of Vf is significantly small, and when the actual widths of the P layer and the N layer is 100 to 500 μm, the value of Vf is substantially the same as the value of Vf in the structure shown in FIG. 4.

It is known from these results that the width of the IGBT and the width of the diode must be at least 50 μm, preferably 100 μm or more. It is also known that the same applies to the P layer and the N layer on the back face side of the silicon substrate provided facing these regions.

Specifically, the widths of the region A and the region B shown in FIG. 1 must be 50 μm or more, preferably 100 μm or more. It was proved from the simulation that the ON characteristics of the IGBT and the diode can be improved by above-described structure.

In the structure shown in FIG. 1, the first trenches 6 in the region A and the second trenches 10 in the region B are formed to have the same width. Thereby, these trenches can be simultaneously formed, and the manufacturing process can be simplified.

As described above, the insulated gate semiconductor device according to the first embodiment has the region A having the second semiconductor layer of the first conductivity type that functions as the emitter of the transistor formed in the vicinity of the surfaces of the first trenches 6, and the region B wherein the above-described second semiconductor layer is not formed in the vicinity of the surfaces of the second trenches 10. In the above-described structure, the region functioning as an IGBT can be enlarged by providing a plurality of first trenches 6. Also, the region functioning as a diode can been larged by providing a plurality of second trenches 10. Therefore, the ON characteristics of the IGBT and the diode can be improved.

Second Embodiment

An insulated gate semiconductor device according to the second embodiment will be described referring to FIG. 9. Here, the description will center on the aspects different from the aspects in the first embodiment.

Figure 9:
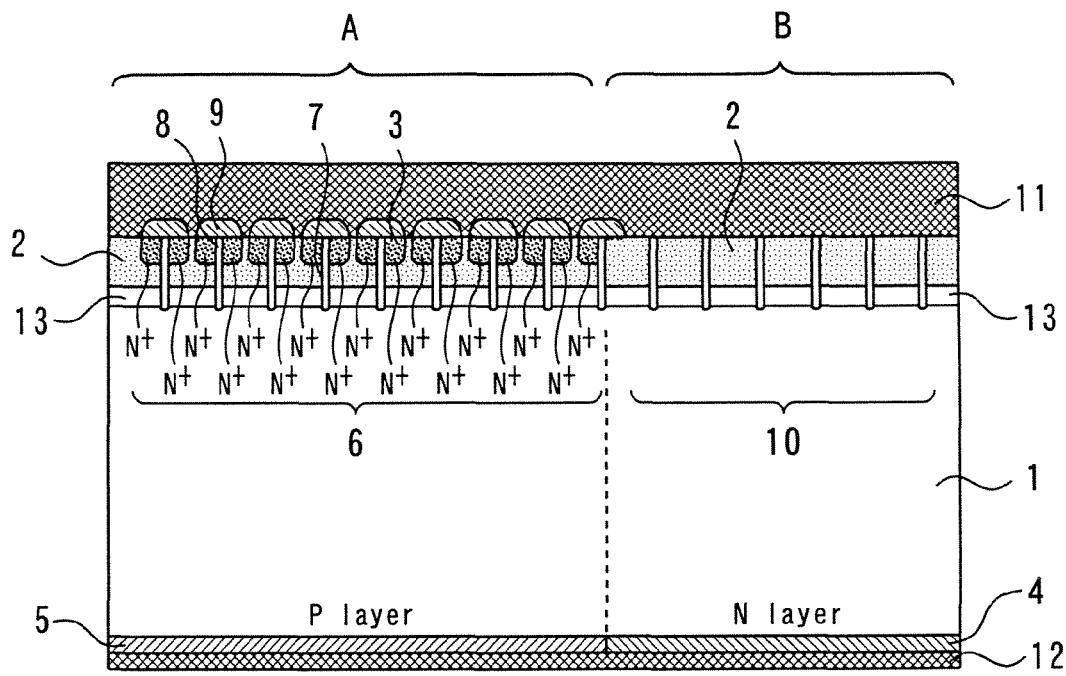
FIG. 9 shows a sectional view of an insulated gate semiconductor device according to the second embodiment.

As FIG. 9 shows, a carrier accumulating layer 13 is formed so as to contact the P base layer 2 on the second major surface side of the P base layer 2 of the N⁻ substrate 1, as a fifth semiconductor layer containing an n-type impurity. The concentration of the n-type impurity in the carrier accumulating layer 13 is higher than the impurity concentration of the N⁻ substrate 1. Other configurations are identical to the configurations of the first embodiment.

Next, the operation of the insulated gate semiconductor device shown in FIG. 9 will be described. The operation of the IGBT shown in FIG. 9 is basically the same as the operation of the IGBT shown in FIG. 1. In the case of the IGBT operation shown in FIG. 9, the carrier accumulating layer 13 acts as the barrier against the holes injected from the collector electrode 12, and the carriers can be accumulated immediately under the P base layer 2. Thereby, the resistance of the N⁻ substrate 1 is lowered, and the on-voltage of the IGBT can be lowered.

In the case of the diode operation, the carrier accumulating layer 13 acts as the barrier against the holes injected from the P base layer 2, and the carrier density in the vicinity of the first major surface is reduced. In the diode operation, carrier density in the vicinity of the surface depends on the peak current in the recovery operation. Therefore, by providing the carrier accumulating layer 13, the peak current in the recovery operation, which caused a problem in the IGBT having a built-in diode, can be suppressed. Other operations are the same as in the structure shown in FIG. 1.

As described above, according to the insulated gate semiconductor device of the second embodiment, in addition to the effects of the first embodiment, the ON characteristics of the IGBT and the recovery characteristics of the diode can be further improved.

Although not shown in the drawings, in the first and second embodiments, it is preferable that the plain pattern (plain pattern viewed from the first major surface side of the N⁻ substrate 1) of the second semiconductor layer (emitter layer 3) is identical to the plain pattern of the third semiconductor layer (collector P layer 5) in the region A, and the plain pattern of the first semiconductor layer (P base layer 2) is identical to the plain pattern of the fourth semiconductor layer (cathode N layer 4) in the region B.

Specifically, the structure wherein the emitter layer 3 is provided on the second major surface side of the N⁻ substrate 1 in the location facing the second semiconductor layer of the region A, and the cathode N layer 4 is provided on the second major surface side of the N⁻ substrate 1 in the location facing the first semiconductor layer of the region B, is preferable. By the above-described structure, the ON characteristics of the IGBT and the diode can be further improved.

Third Embodiment

An insulated gate semiconductor device according to the third embodiment will be described referring to FIG. 10. Here, the description will center on the aspects different from the aspects in the first and second embodiments.

Figure 10:
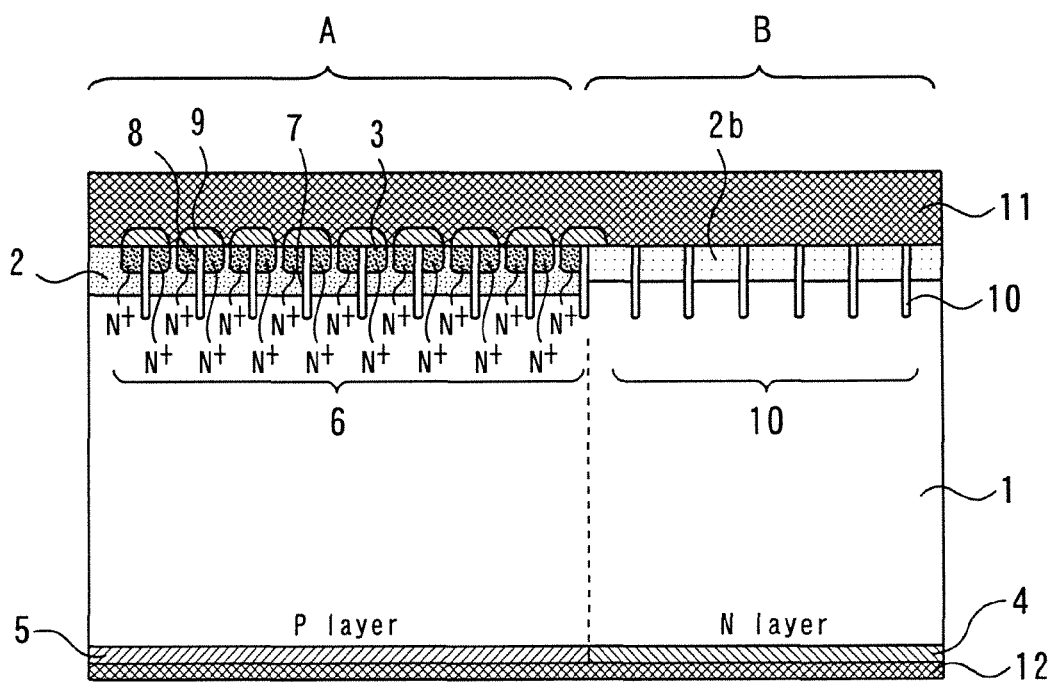
FIG. 10 shows a sectional view of an insulated gate semiconductor device according to the third embodiment.

In the insulated gate semiconductor device shown in FIG. 10, the impurity concentration of the P base layer 2 provided in the region A is different from the impurity concentration of the P base layer 2b provided in the region B. Specifically, the impurity concentration of the P base layer 2b provided in the region B is lower than the impurity concentration of the P base layer 2 provided in the region A. Other configurations are identical to the configurations of the first embodiment.

The operation of the IGBT shown in FIG. 10 is basically the same as the operation of the IGBT shown in FIG. 1. In the third embodiment, the first semiconductor layer functioning as the P base layer of the IGBT has a different impurity concentration from the impurity concentration of the first semiconductor layer functioning as the anode P layer of the diode. Thereby, the characteristics of the IGBT and the characteristics of the diode can be individually controlled.

Furthermore, in the third embodiment, since the impurity concentration of the P base layer 2b in the region B is lowered as the anode of the diode, in the diode operation, the quantity of the holes injected from the P base layer is lowered. Therefore, the injection of holes is suppressed when the diode is turned on, the carrier density in the vicinity of the first major surface is lowered, and the peak current on the recovery operation can be reduced.

According to the third embodiment, therefore, in addition to the effects shown in the first embodiment, the recovery characteristics of the diode can be improved.

Figure 11:
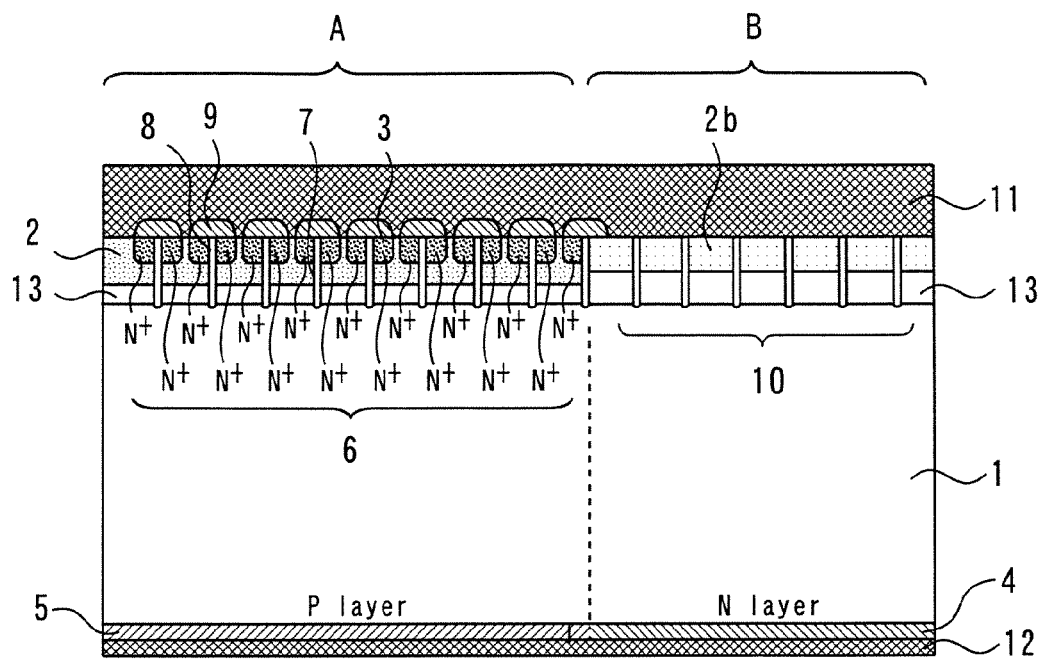
FIG. 11 shows a sectional view of an insulated gate semiconductor device according to the modification of the third embodiment.

Next, a modification of the third embodiment will be described. In the structure of this modification, as FIG. 11 shows, a carrier accumulating layer 13 contacting the P base layer 2 is provided on the second major surface of the P base layer 2 in the region A, and another carrier accumulating layer 13 contacting the P base layer 2b is provided on the second major surface of the P base layer 2b in the region B. Other configurations are identical to the configurations shown in FIG. 10.

According to the above-described structure, by providing the carrier accumulating layer 13, the peak current in recovery operation of the IGBT having a built-in diode can be suppressed. Therefore, the recovery characteristics of the IGBT can be more improved than the structure shown in FIG. 10.

Fourth Embodiment

An insulated gate semiconductor device according to the fourth embodiment will be described referring to FIG. 12. Here, the description will center on the aspects different from the aspects in the first embodiment.

Figure 12:
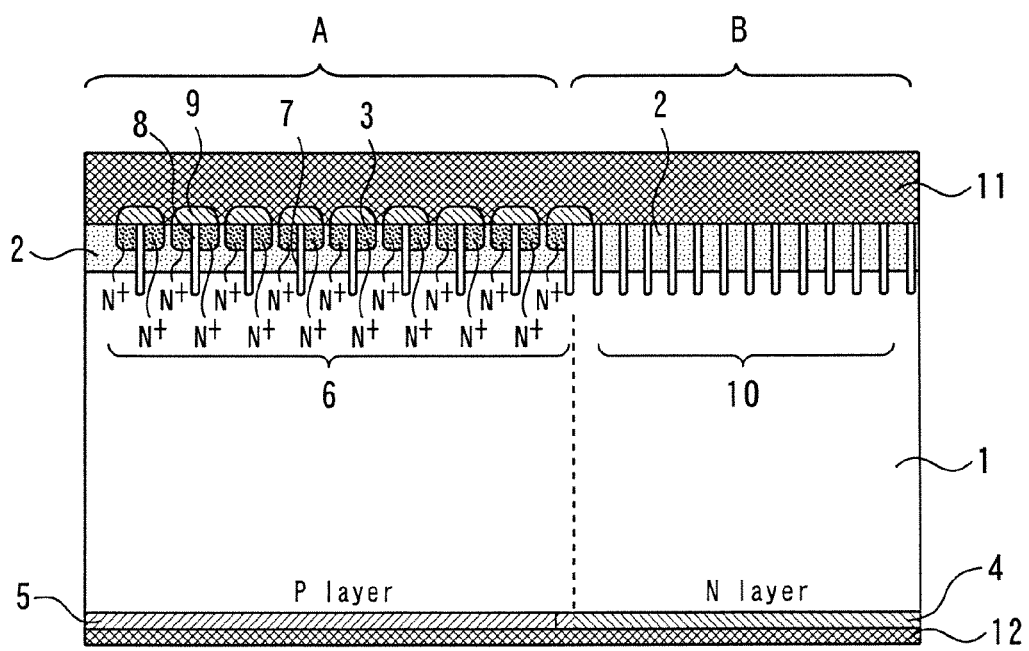
FIG. 12 shows a sectional view of an insulated gate semiconductor device according to the fourth embodiment.

In the insulated gate semiconductor device shown in FIG. 12, a plurality of first trenches 6 are provided in the region A. These trenches are equally spaced at a first interval. In the region B, a plurality of second trenches 10 are provided, and these trenches are equally spaced at a second interval. In the fourth embodiment, the second interval is smaller than the first interval. Other configurations are identical to the configurations of the first embodiment.

The operation of the IGBT shown in FIG. 12 is basically the same as the operation of the IGBT shown in FIG. 1. However, since a larger number of trenches are provided in the region B compared with the structure of FIG. 1, the area of the P base layer 2 contributing as the anode of the diode when the diode is turned on is relatively reduced compared with the first embodiment. Thereby, the injection of holes to the P base layer 2 is suppressed, and the carrier density in the vicinity of the first major surface is reduced. Therefore, the peak current in the recovery operation can be lowered, and the recovery characteristics of the diode can be improved.

According to the insulated gate semiconductor device of the fourth embodiment, therefore, in addition to the effects shown in the first to third embodiments, the recovery characteristics of the diode can be further improved.

Figure 13:
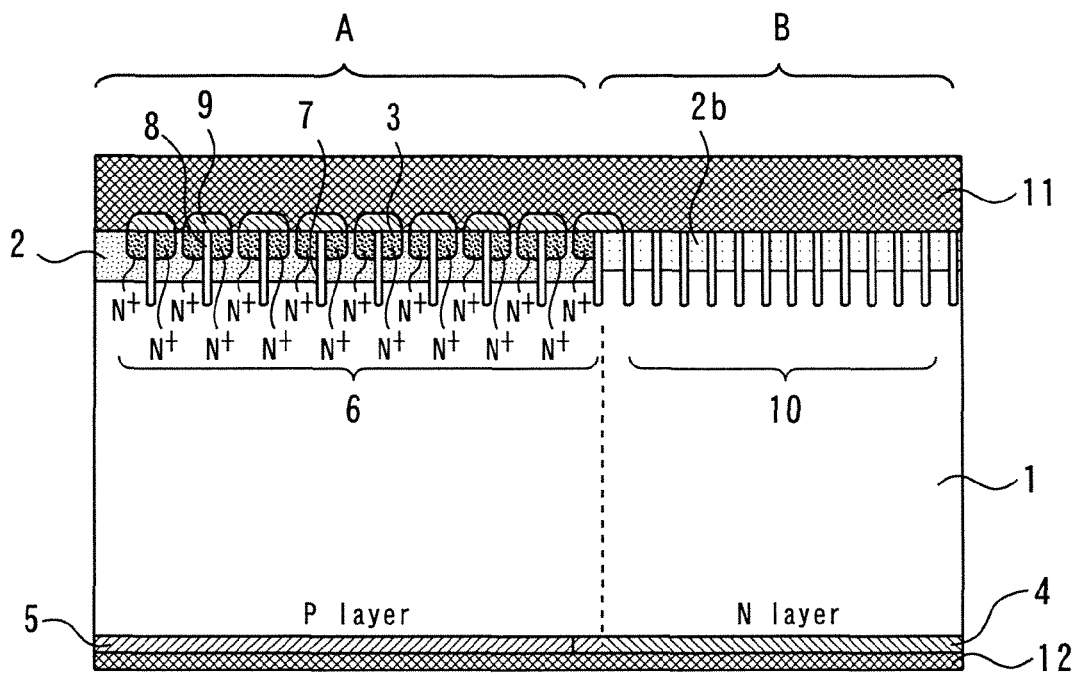
FIG. 13 shows a sectional view of an insulated gate semiconductor device according to the first modification of the fourth embodiment.

Next, a first modification the fourth embodiment will be described. In the first modification, as FIG. 13 shows, the impurity concentration of the P base layer 2b in the region B is relatively lower than the impurity concentration of the P base layer 2 in the region A. Other configurations are identical to the configuration of the structure shown in FIG. 12.

In the first modification, since the impurity concentration of the P base layer 2b in the region B is relatively lower than the impurity concentration of the P base layer 2 in the region A, compared with the structure shown in FIG. 12, the quantity of holes injected from the P base layer in the diode operation is lowered. Thereby, the injection of holes when the diode is turned on is further suppressed compared with the structure shown in FIG. 12, the carrier density in the vicinity of the first major surface is reduced, and the peak current in the recovery operation can be lowered.

Figure 14:
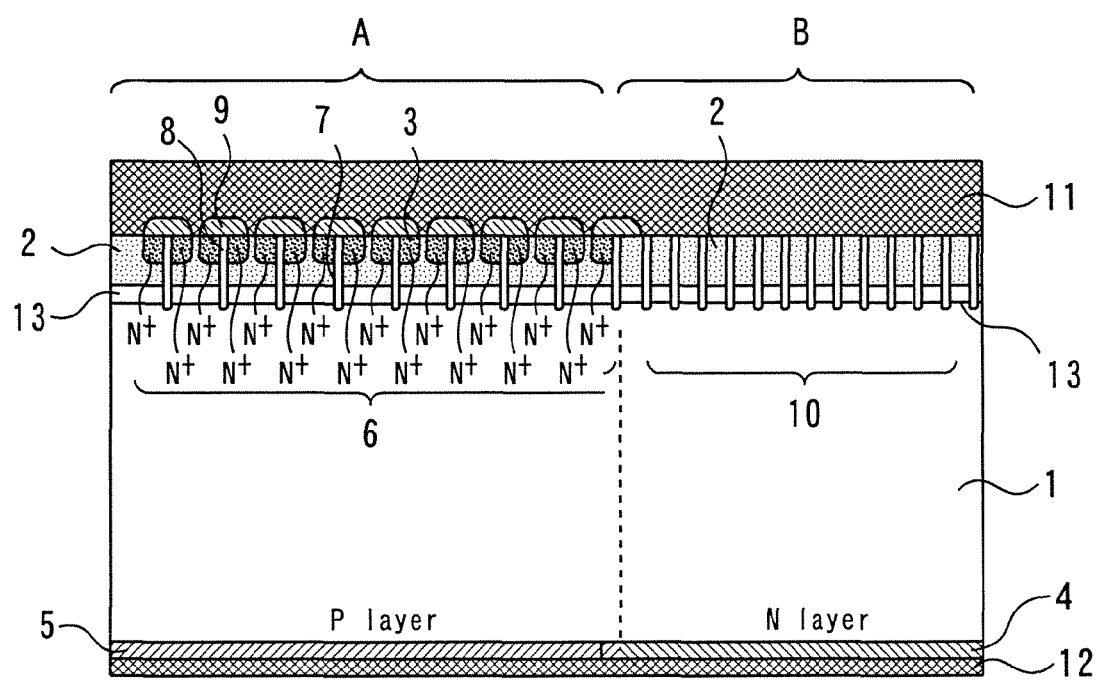
FIG. 14 shows a sectional view of an insulated gate semiconductor device according to the second modification of the fourth embodiment.

Next, a second modification the fourth embodiment will be described. As FIG. 14 shows, the second modification has a structure wherein a carrier accumulating layer 13 contacting the P base layer 2 is provided on the second major surface side of the P base layer 2 in the region A and the region B. Other configurations are identical to the configuration of the structure shown in FIG. 12.

In the second modification, since the carrier accumulating layer 13 is provided, the peak current in the recovery operation, which causes problems in the IGBT having a built-in diode, can be suppressed. Therefore, the peak current in the recovery operation of the IGBT can be further suppressed compared with the structure shown in FIG. 12.

Figure 15:
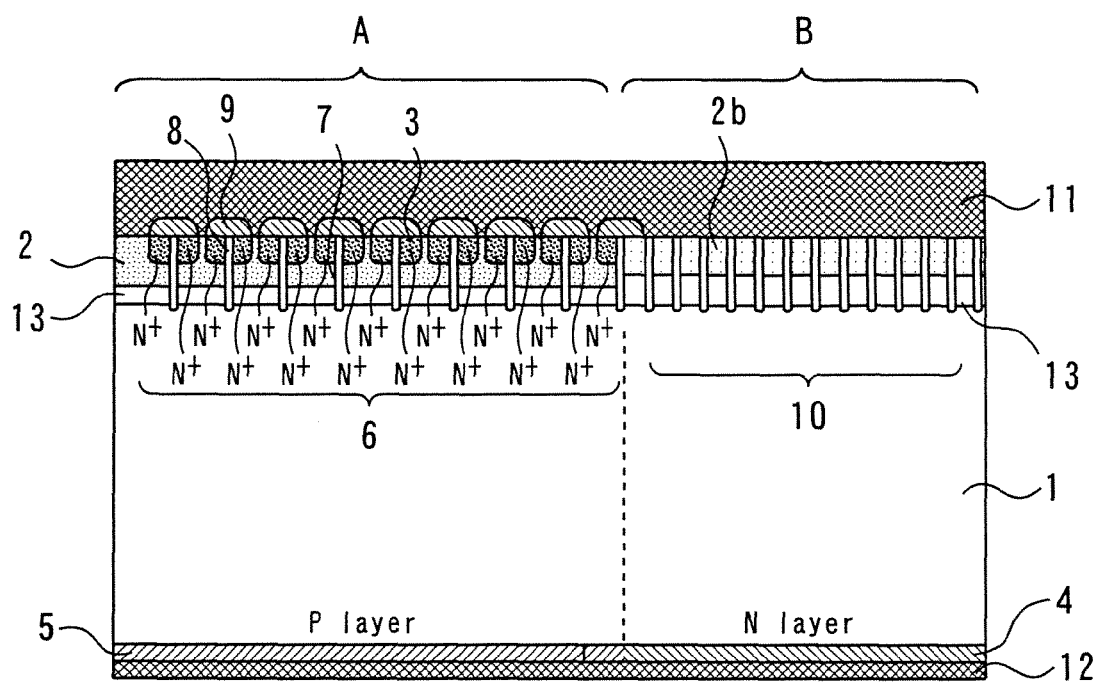
FIG. 15 shows a sectional view of an insulated gate semiconductor device according to the third modification of the fourth embodiment.

Next, a third modification the fourth embodiment will be described. In the third modification, as FIG. 15 shows, the impurity concentration of the P base layer 2b in the region B is relatively lower than the impurity concentration of the P base layer 2 in the region A. Other configurations are identical to the configuration of the structure shown in FIG. 14.

In the third modification, since the impurity concentration of the P base layer 2b in the region B is relatively lower than the impurity concentration of the P base layer 2 in the region A, compared with the structure shown in FIG. 14, the quantity of holes injected from the P base layer in the diode operation is lowered. Thereby, the injection of holes when the diode is turned on is further suppressed compared with the structure shown in FIG. 14, the carrier density in the vicinity of the first major surface is reduced, and the peak current in the recovery operation can be lowered.

Fifth Embodiment

An insulated gate semiconductor device according to the fifth embodiment will be described referring to FIGS. 16 and 17. Here, the description will center on the aspects different from the aspects in the first embodiment.

Figure 16:
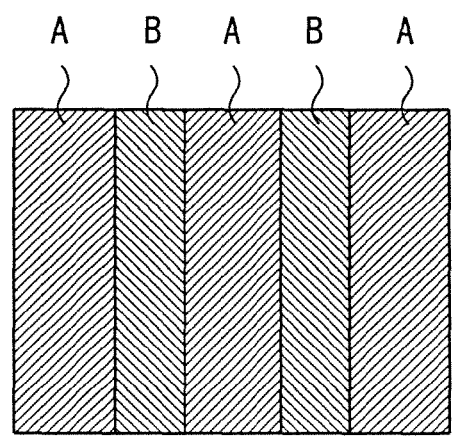
FIGS. 16 an 17 show plain views of an insulated gate semiconductor device according to the fifth embodiment.

FIG. 16 shows the plain structure of regions A and regions B when the insulated gate semiconductor device shown in FIG. 1 is viewed from the side of the first major surface. The fifth embodiment has a structure wherein regions A and regions B are alternately provided in stripes when viewed from the first major surface side of the N⁻ substrate 1.

Figure 17:
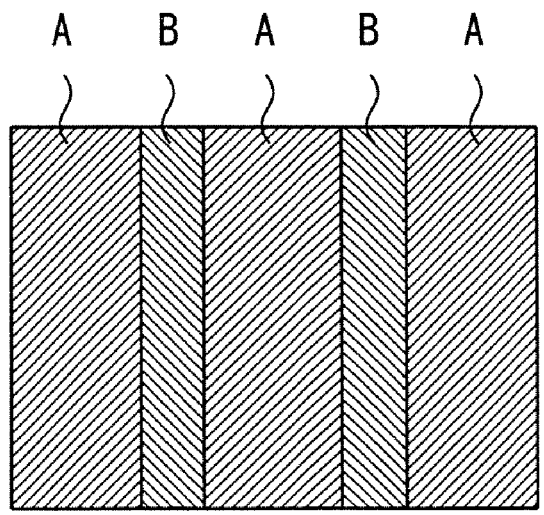

FIG. 17 shows the plain structure when the widths of the regions A and regions B shown in FIG. 16 are changed. By changing the widths of the regions A and regions B, the ratio of the IGBT region to the diode region can be optionally changed.

By the above-described structure, when the IGBT and the diode are operated, they can be evenly operated. The ratio of the IGBT elements and the diode elements can be freely set.

Sixth Embodiment

An insulated gate semiconductor device according to the sixth embodiment will be described referring to FIG. 18. Here, the description will center on the aspects different from the aspects in the first and fifth embodiments.

Figure 18:
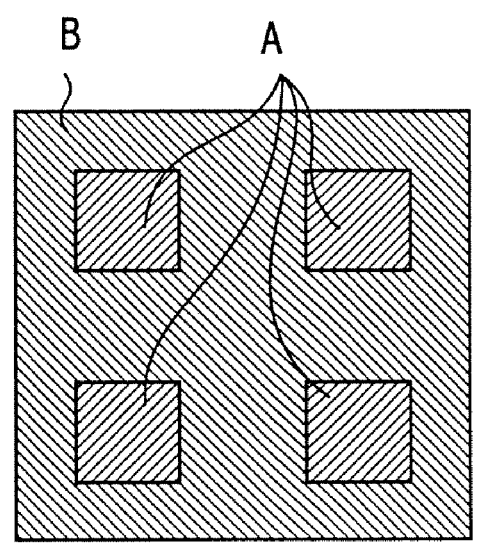
FIG. 18 shows a plain view of an insulated gate semiconductor device according to the sixth embodiment.

FIG. 18 shows the plain structure of regions A and a region B when the insulated gate semiconductor device shown in FIG. 1 is viewed from the side of the first major surface. The sixth embodiment has a structure wherein regions A are surrounded by the region B when viewed from the first major surface side of the N⁻ substrate 1. The cross-sectional structure is the same as in the first embodiment.

By the above-described structure, in the same manner as the fifth embodiment, the ratio of the IGBT region to the diode region can be optionally changed.

When the width of the regions A shown in FIG. 18 is the same as the width of the regions A shown in FIG. 16, in the structure shown in FIG. 18, the area ratio of the region B can be larger than that of the structure shown in FIG. 16. Specifically, since the area operating as a diode can be widened, the elevation of Vf when the gate is turned on can be effectively suppressed.

In the fifth and sixth embodiments, examples wherein the area ratio of the regions A to the regions B was variable were shown. However, different from simulation, electrons are supplied through channels to the regions A (IGBT regions). Whereas, in the regions B (diode regions), holes and electrons are directly supplied from the P base layer 2 and the cathode N layer 4, respectively. Therefore, by making the area of the IGBT region relatively larger than the area of the diode region, the values of the $V_{CE}$ (sat) of the IGBT region and the Vf of the diode region can be approximately equalized.

Therefore, by making the width of the regions A relatively larger than the regions B, when the IGBT and the diode are simultaneously operated, their ON-characteristics can be easily equalized.

Seventh Embodiment

In the seventh embodiment, the description will center on the method for manufacturing an insulated gate semiconductor device shown in the first embodiment.

Figure 19:
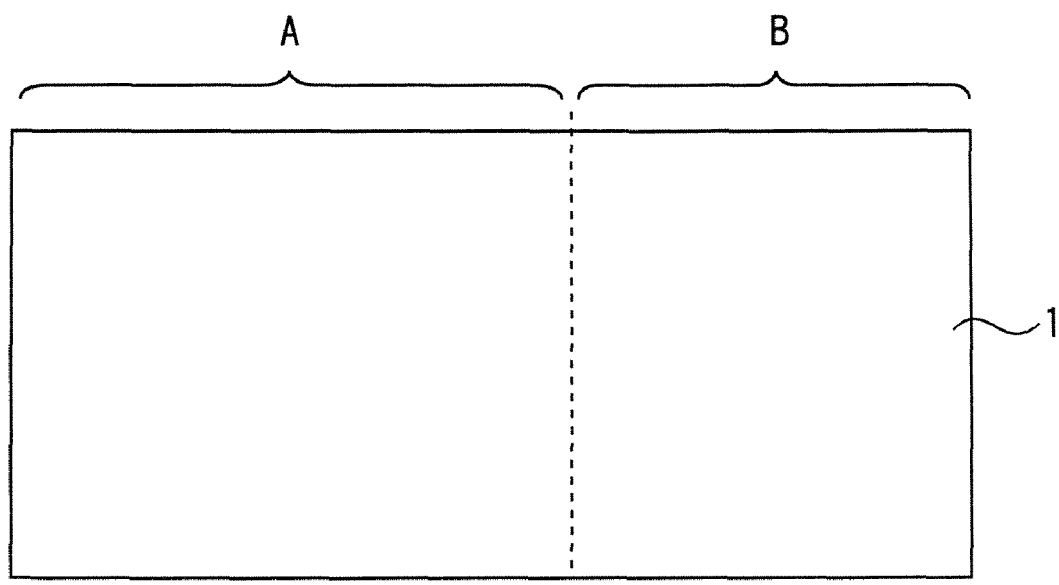
FIGS. 19-28 are sectional views for explaining a method of manufacturing an insulated gate semiconductor device according to the seventh embodiment.
Figure 20:
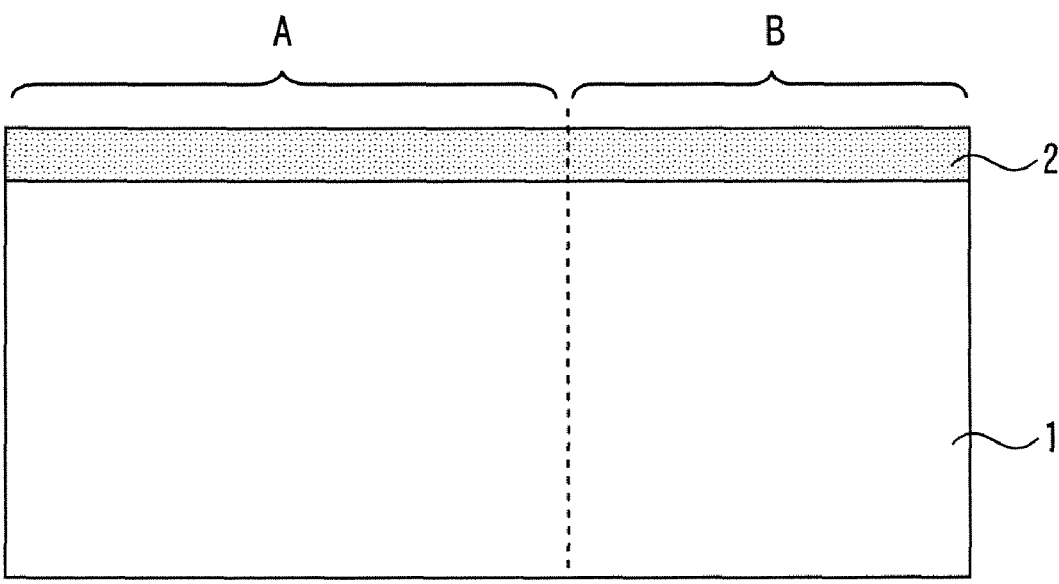

First, as FIG. 19 shows, an N⁻ substrate 1 containing an n-type impurity and having a first major surface (upper surface) and a second major surface (lower surface) is prepared. Next, as FIG. 20 shows, in the region A and the region B adjoining the region A of the N⁻ substrate 1, a P base layer 2 is formed in the vicinity of the first major surface as a p-type first semiconductor layer.

Figure 21:
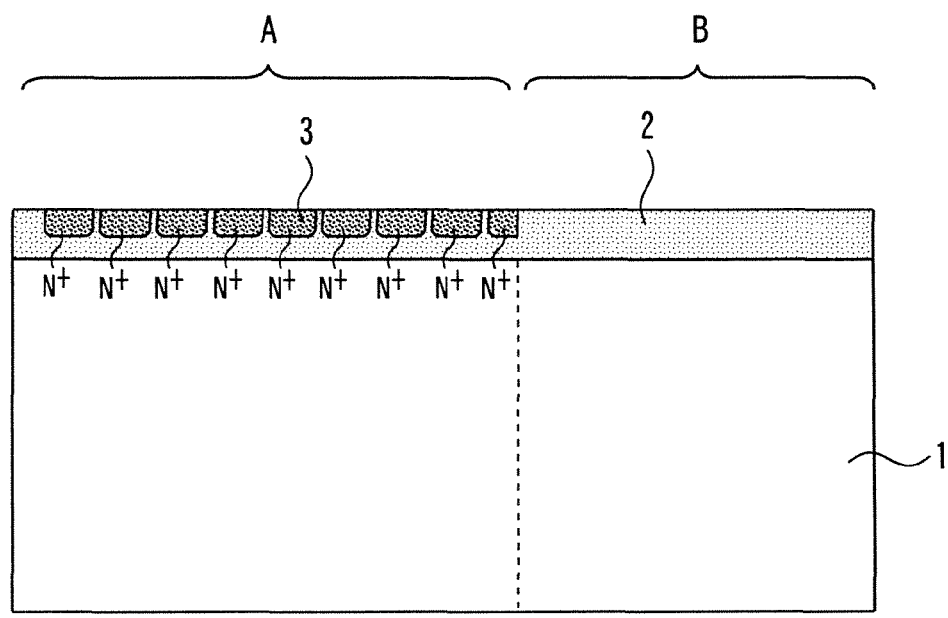

Next, as FIG. 21 shows, in the region A of the N⁻ substrate 1, emitter layers 3 are selectively formed in the vicinity of the first major surface inside the P base layer 2 as n-type second semiconductor layers. At this time, the emitter layers can be formed in the region B.

Figure 22:
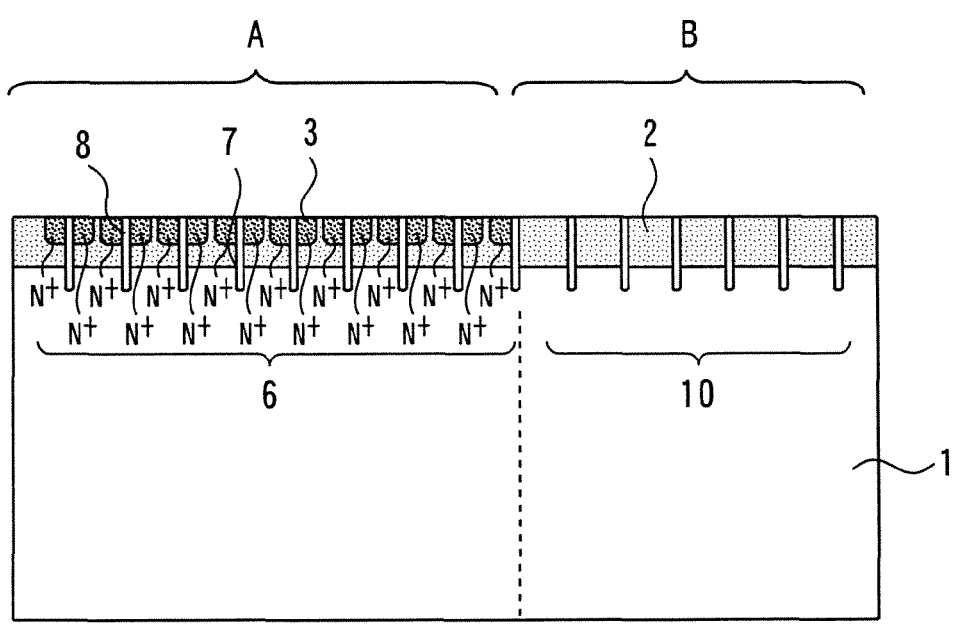
Figure 23:
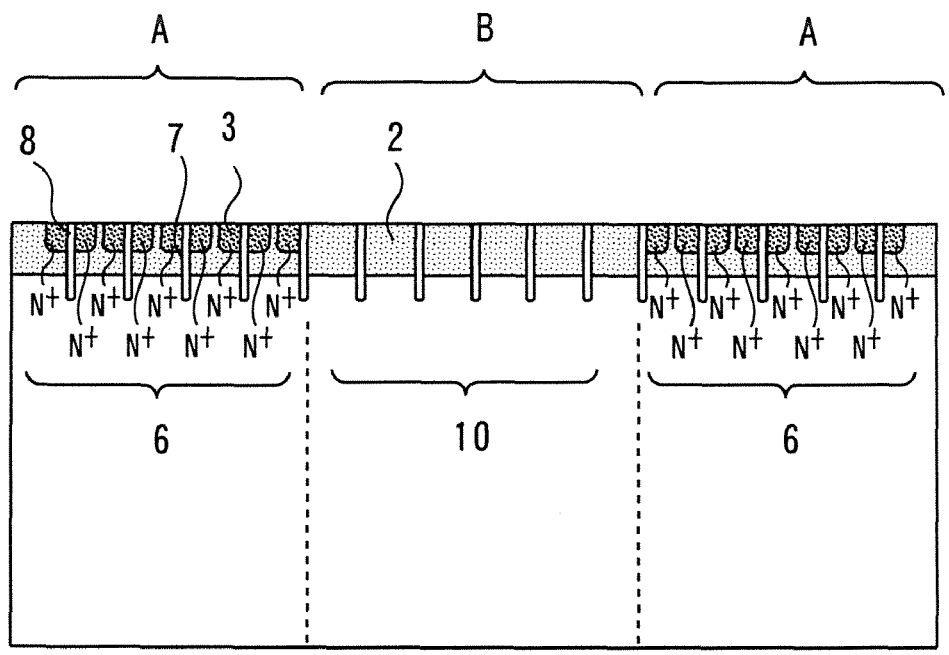
Figure 24:
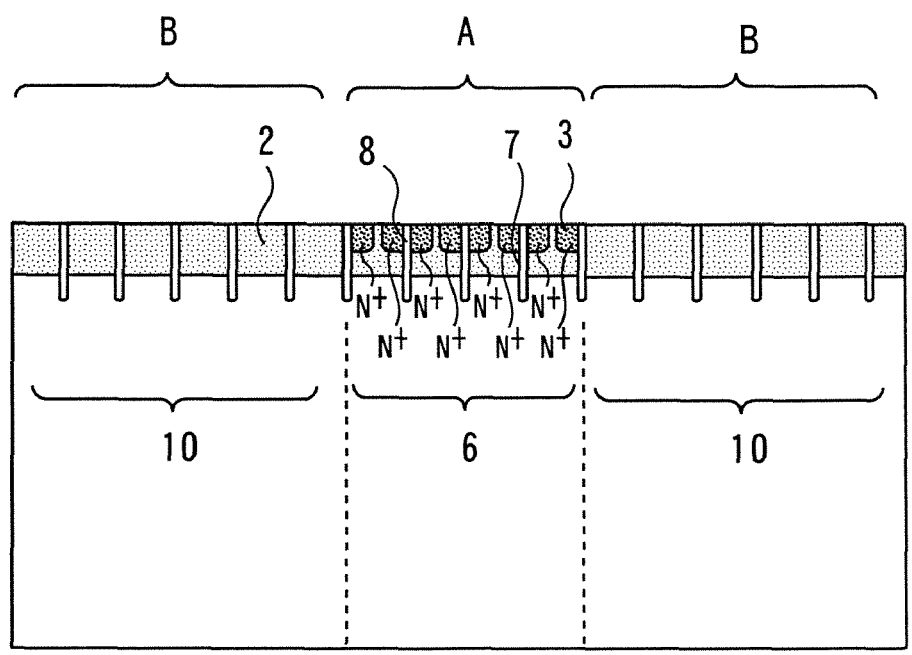

Next, as FIG. 22 shows, a plurality of first trenches 6 that penetrate the emitter layers 3 and the P base layer 2 from the first major surface of the N⁻ substrate 1, whose ends reach the N⁻ substrate 1 are formed in the region A of the N⁻ substrate 1. (When a plurality of regions A are provided in the N⁻ substrate 1 as FIG. 23 shows, a plurality of first trenches 6 are formed in each region A.) A plurality of second trenches 10 that penetrate the P base layer 2 from the first major surface of the N⁻ substrate 1, whose ends reach the N⁻ substrate 1 are formed in the region B adjoining the region A of the N⁻ substrate 1. (When a plurality of regions B are provided in the N⁻ substrate 1 as FIG. 24 shows, a plurality of second trenches 10 are formed in each region B.)

Next, gate insulating films 7 are formed on the inner surfaces of the first trenches 6, polysilicon films are formed through the insulating films on the inner surfaces of the first trenches 6, and etch back is performed to bury the conductive films 8. Also, gate insulating films 7 are formed on the inner surfaces of the second trenches 10, polysilicon films are formed through the insulating films on the inner surfaces of the second trenches 10, and etch back is performed to bury the conductive films 8.

Figure 25:
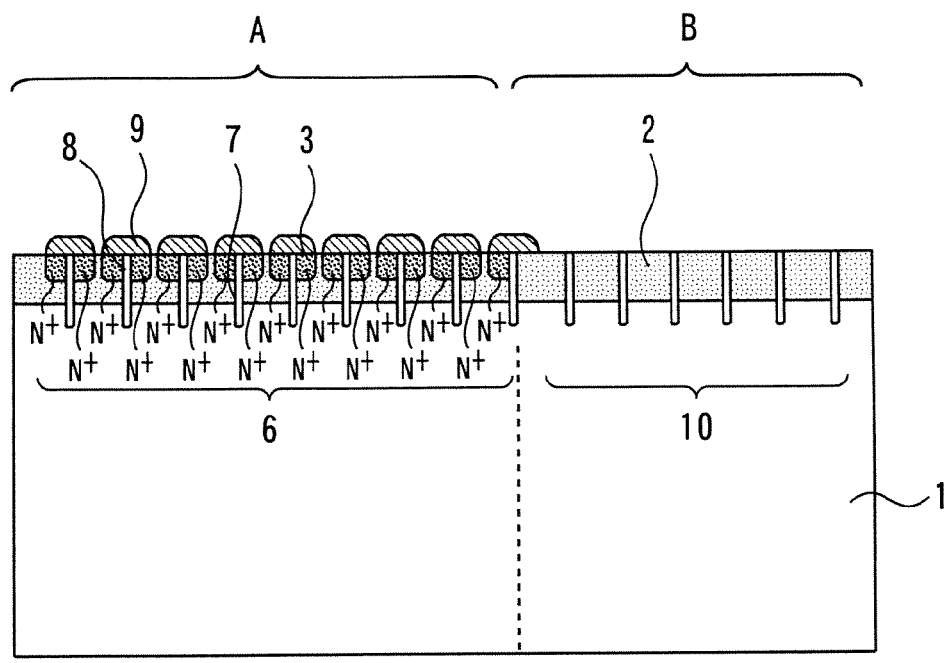
Figure 26:
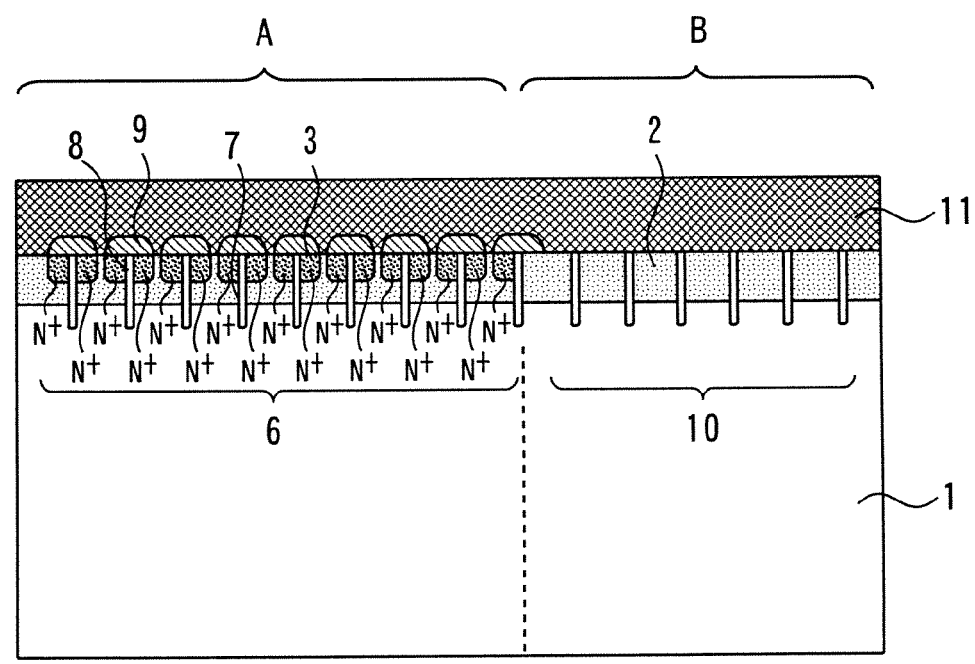

Next, as FIG. 25 shows, interlayer films 9 are formed on the first trenches 6 and the emitter layer 3. Then, as FIG. 26 shows, an emitter electrode 11 is formed on the first major surface of the N⁻ substrate 1 as a first major electrode. At this time, the emitter electrode 11 is electrically connected to the P base layer 2 and the emitter layer 3. The emitter electrode 11 is also electrically connected to the conductive films 8 in the second trenches 10.

Figure 27:
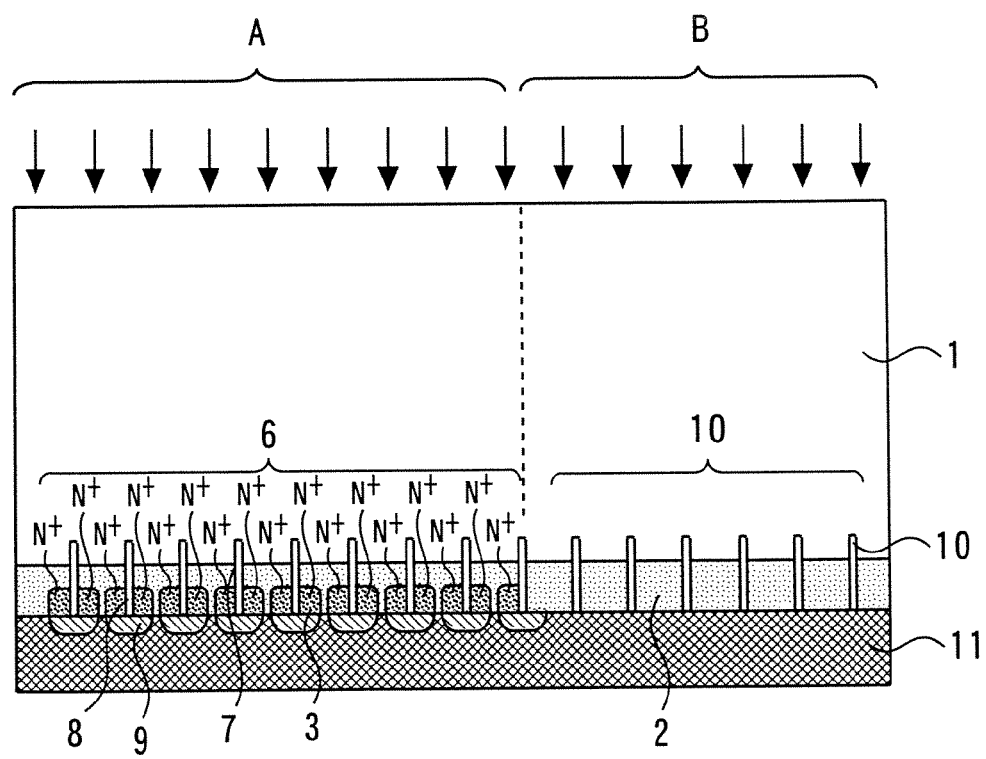

Next, as FIG. 27 shows (in FIG. 27, the second major surface of the N⁻ substrate 1 is shown upside), boron ions are implanted from the second major surface side into the region A of the N⁻ substrate 1. Also, phosphorus ions are implanted from the second major surface side into the region B of the N⁻ substrate 1. Then, the N⁻ substrate 1 is heat-treated to activate ion-implanted boron and phosphorus.

Figure 28:
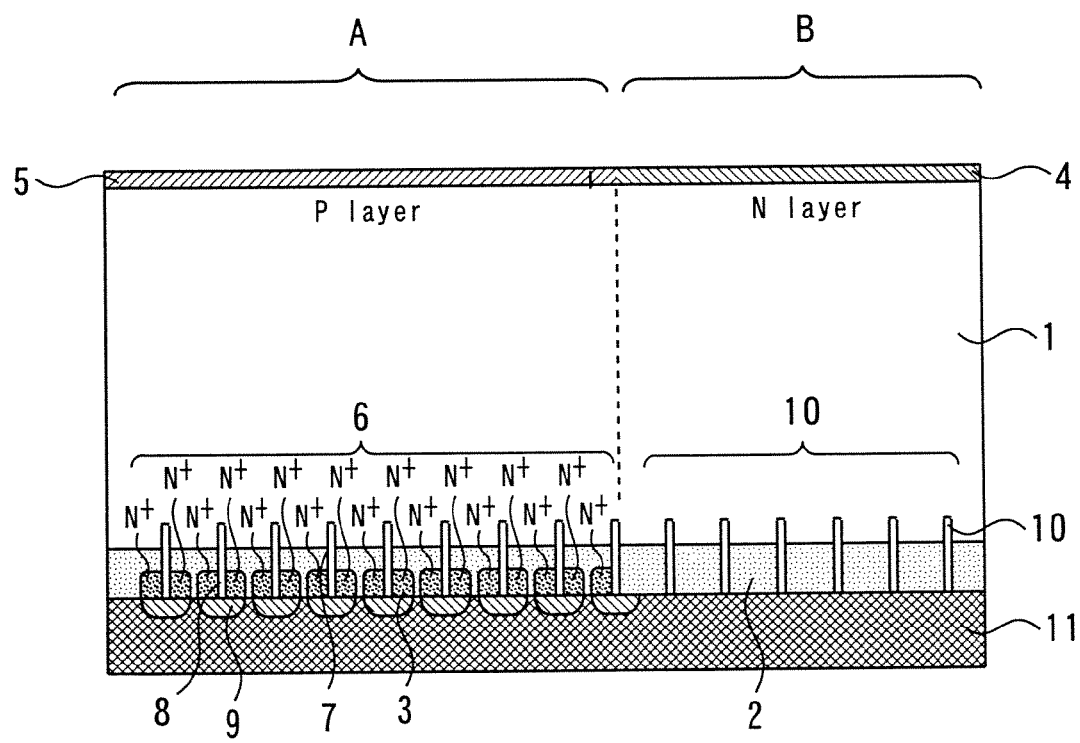

As a result, as FIG. 28 shows (in FIG. 28, the second major surface of the N⁻ substrate 1 is shown upside), a collector P layer 5 is formed in the vicinity of the second major surface of the region A in the N⁻ substrate 1 as a p-type third semiconductor layer. Also, a cathode N layer 4 is formed in the vicinity of the second major surface of the region B in the N⁻ substrate 1 as an n-type fourth semiconductor layer.

Furthermore, a collector electrode is formed on the second major surface of the N⁻ substrate 1 as second major electrode, so as to coat the collector P layer 5 and the cathode N layer 4. As a result, the structure shown in FIG. 1 can be obtained.

In the step for forming the second trenches 10, by making the interval of adjoining second trenches 10 (second interval) narrower than the interval of adjoining first trenches 6 (first interval), the structure shown in FIG. 12 can be obtained.

Eighth Embodiment

In the eighth embodiment, the description will center on the method for manufacturing an insulated gate semiconductor device shown in the second embodiment. Here, the description will center on the aspects different from the aspects in the seventh embodiment.

Figure 29:
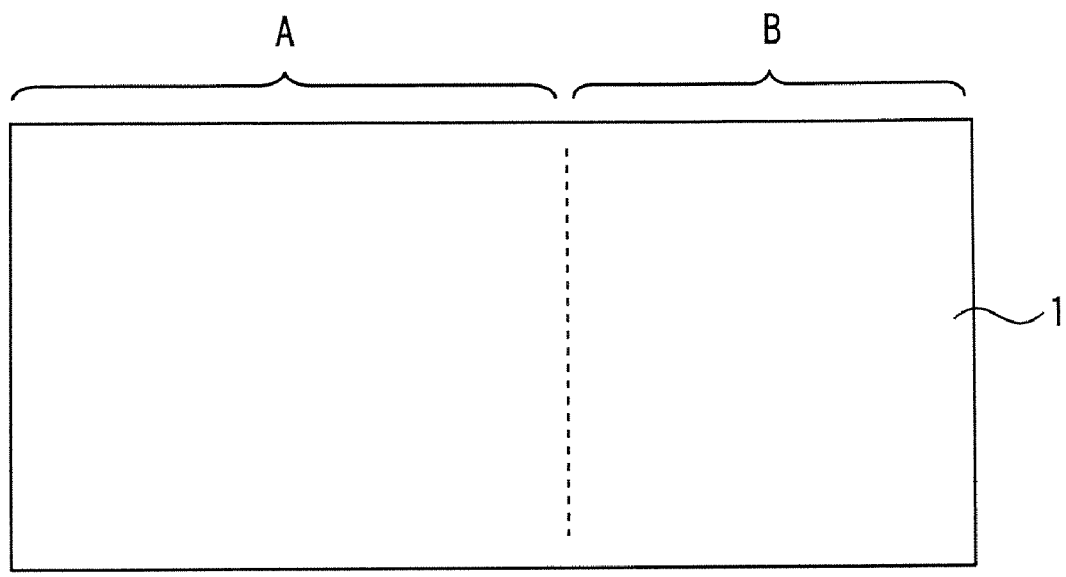
FIGS. 29-31 are sectional views for explaining a method of manufacturing an insulated gate semiconductor device according to the eighth embodiment.

First, as FIG. 29 shows, an N⁻ substrate 1 containing an n-type impurity and having a first major surface (upper surface) and a second major surface (lower surface) is prepared.

Figure 30:
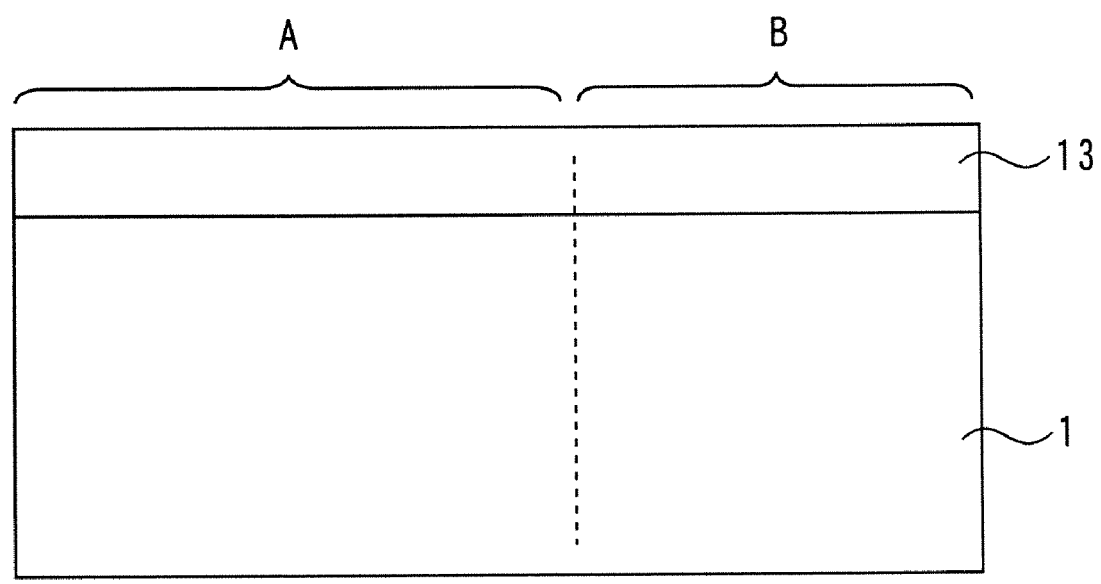
Figure 31:
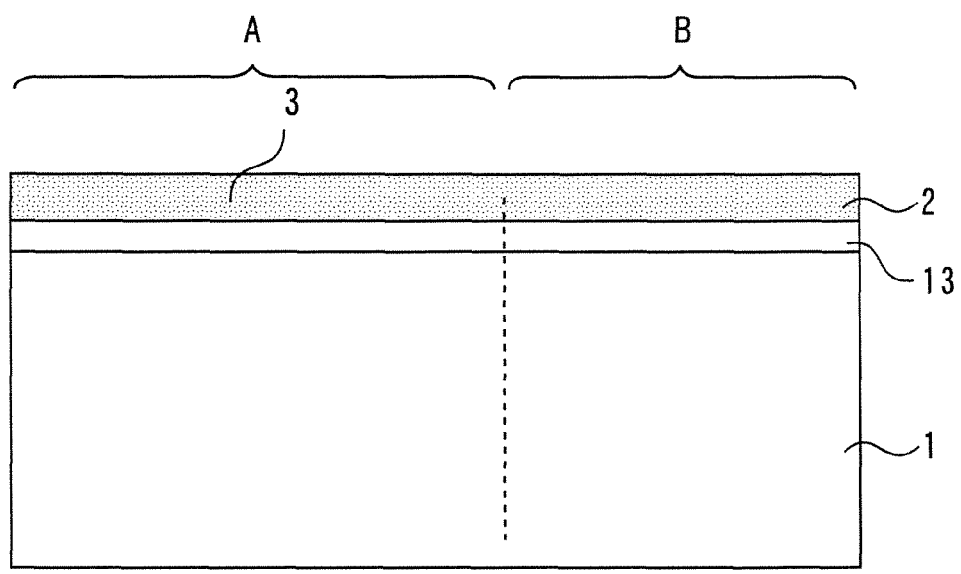

Next, as FIG. 30 shows, a carrier accumulating layer 13 is formed in the vicinity of the first major surface of the N⁻ substrate 1 as an n-type fifth semiconductor layer having a higher concentration of the n-type impurity than the N⁻ substrate 1. Next, as FIG. 31 shows, a P base layer 2 is formed between the first major surface of the N⁻ substrate 1 and the carrier accumulating layer 13. The subsequent steps are the same as in the seventh embodiment.

Specifically, the method for manufacturing an insulated gate semiconductor device according to the eighth embodiment includes a step for forming an n-type carrier accumulating layer 13 having a higher concentration of the impurity than the N⁻ substrate 1 in the vicinity of the first major surface of the N⁻ substrate 1, before the step for forming a P base layer 2. In the step for forming a P base layer 2, a P base layer 2 is formed between the first major surface of the N⁻ substrate 1 and the carrier accumulating layer 13. As a result, the structure shown in FIG. 9 can be obtained.

Ninth Embodiment

In the ninth embodiment, the description will center on the method for manufacturing an insulated gate semiconductor device shown in the third embodiment. Here, the description will center on the aspects different from the aspects in the seventh embodiment.

Figure 32:
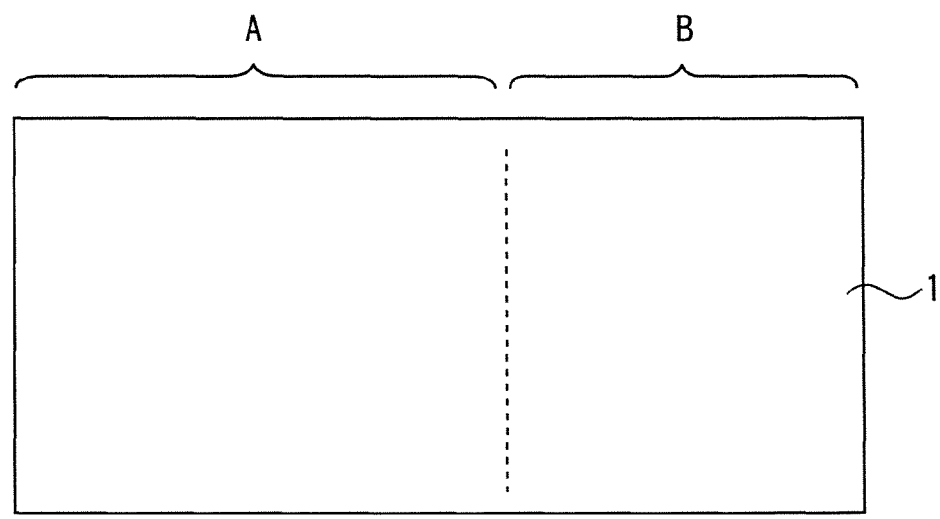
FIGS. 32-34 are sectional views for explaining a method of manufacturing an insulated gate semiconductor device according to the ninth embodiment.

First, as FIG. 32 shows, an N⁻ substrate 1 containing an n-type impurity and having a first major surface (upper surface) and a second major surface (lower surface) is prepared.

Figure 33:
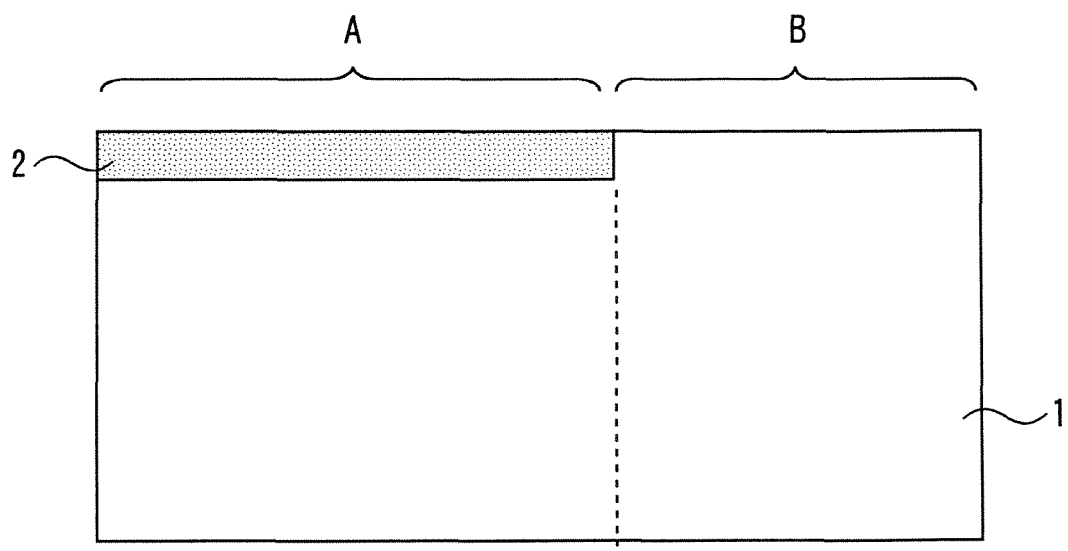
Figure 34:
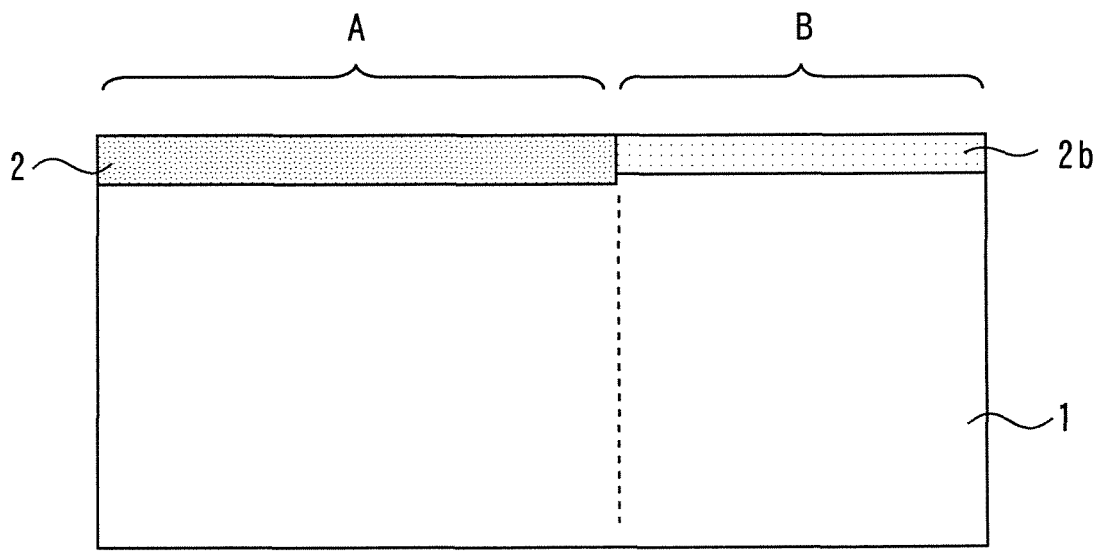
Figure 35:
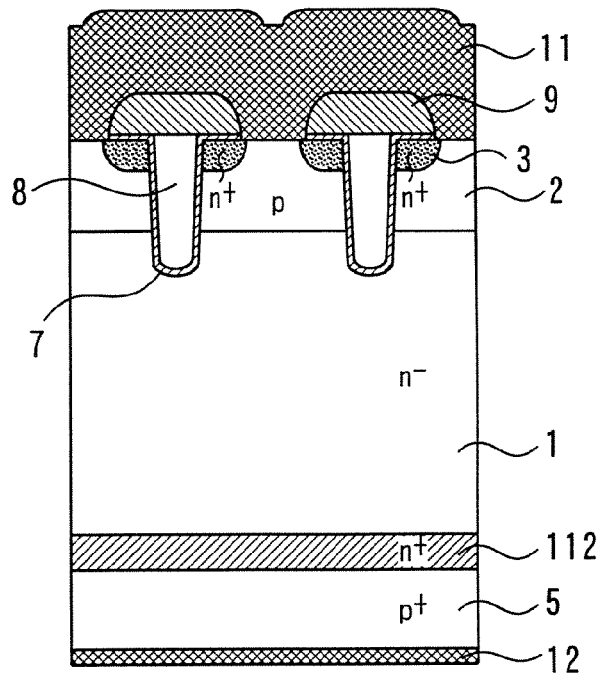
FIG. 35 shows the cross-sectional structure of a conventional IGBT.
Figure 36:
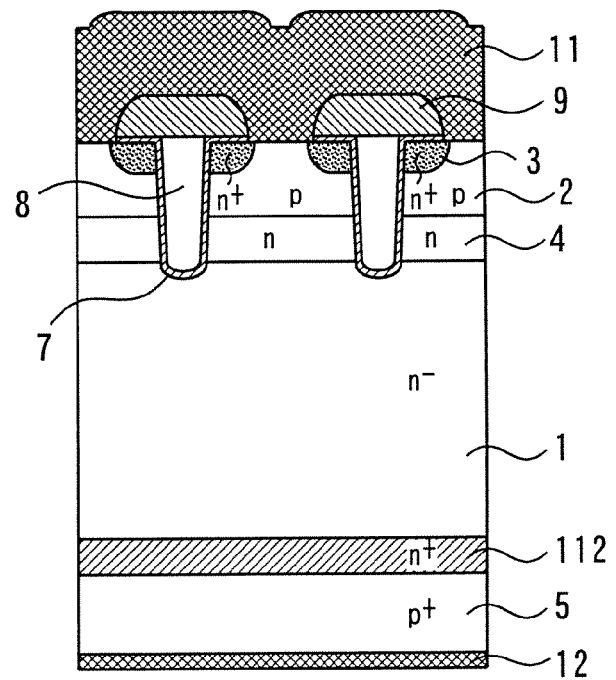
FIG. 36 shows a sectional view in the vicinity of a unit cell of the IGBT invented by the present inventors for improving the characteristics of the above-described IGBT.
Figure 37:
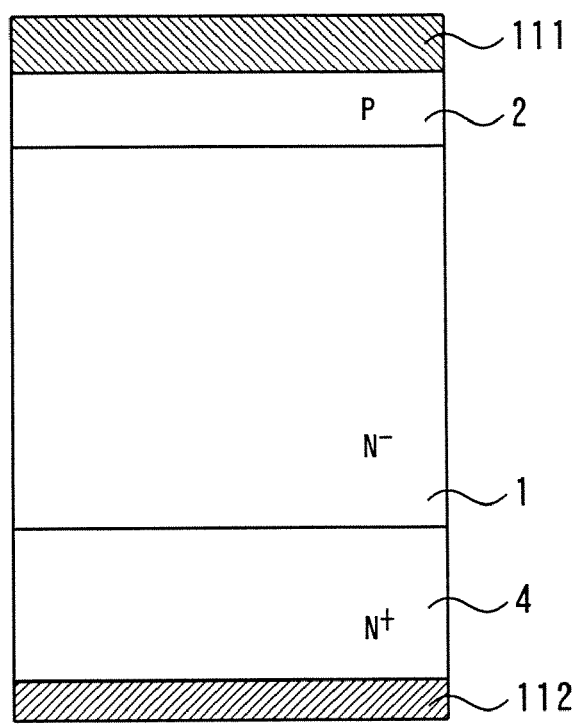
FIG. 37 is a sectional view showing the basic structure of a diode provided in parallel to the IGBT.
Figure 38:
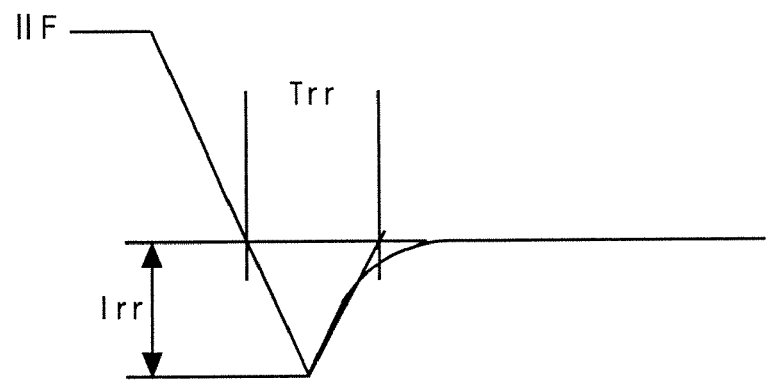
FIG. 38 shows a current waveform in inverse recovery when the diode shown in FIG. 37 is switched from the ON state to the OFF state.
Figure 39:
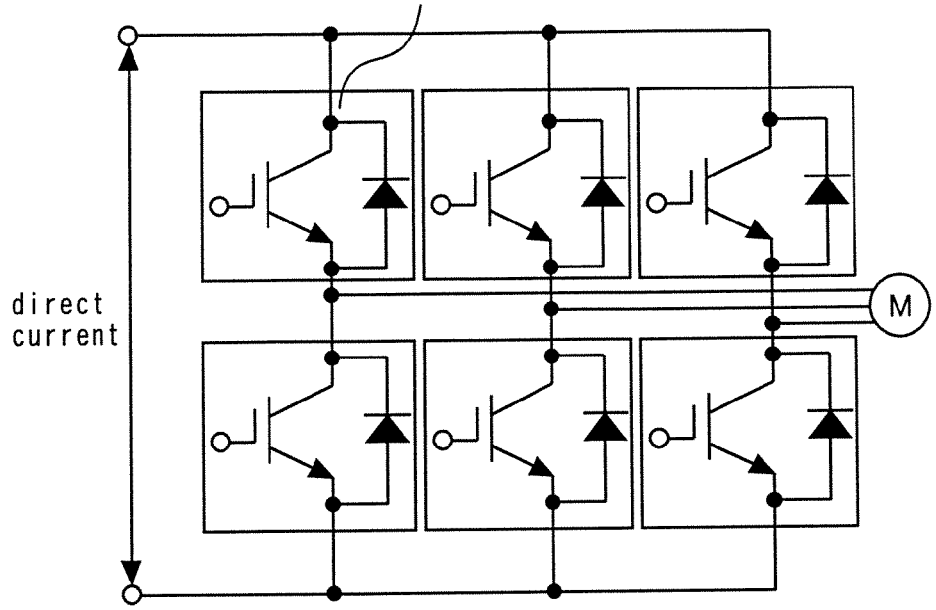
FIG. 39 shows the configuration of an ordinary inverter circuit using the above-described IGBT.

Next, as FIG. 33 shows, a P base layer 2 is formed in the region A of the N⁻ substrate 1. Then, as FIG. 34 shows, a P base layer 2b having a lower impurity concentration than the P base layer in the region A is formed in the region B of the N⁻ substrate 1. Thus, the step for forming the P base layer shown in the seventh embodiment is performed in two steps, so that the impurity concentration in the P base layer 2 in the region A is different from the impurity concentration in the P base layer 2b in the region B. The subsequent steps are the same as in the seventh embodiment. As a result, the structure shown in FIG. 10 can be obtained.

The order of the steps for forming the above-described P base layer 2 in the region A and P base layer 2 in the region B is optional. The P layers can be simultaneously formed in the regions A and B, and a step for elevating only the impurity concentration of the P base layer in the region A can be added.

The order of step for forming an insulating film on the inner surfaces of the second trenches and the step for burying the conductive films in the trenches shown in the seventh embodiment can be changed as long as it is after the step for forming the second trenches and before the step for forming the emitter electrode 11.

The step for forming the second trenches 10 shown in the seventh to ninth embodiments can be simultaneously carried out with the step for forming the first trenches 6. Thereby, the total manufacturing process can be simplified.

The step for forming an insulating film on the inner surfaces of the second trenches 10 shown in the seventh to ninth embodiments can be simultaneously carried out with the step for forming the gate insulating films 7 on the inner surfaces of the first trenches 6. Thereby, the total manufacturing process can be simplified.

The step for burying the conductive films in the second trenches 10 shown in the seventh to ninth embodiments can be simultaneously carried out with the step for burying the conductive films in the first trenches 6. Thereby, the total manufacturing process can be simplified.

The order of the step for forming the collector layer 5 and the step for forming the cathode N layer 4 shown in the seventh to ninth embodiments is optional.

The step for forming the collector P layer 5 and the step for forming the cathode N layer 4 shown in seventh to ninth embodiments can be conducted before the step for forming the emitter electrode 11.

Also in the structure shown in FIG. 1, even if an n-type impurity layer is formed inside the P base layer 2 in the region B, the similar effects as the structure shown in FIG. 1 can be achieved when it is not operated as an emitter.

In the first to ninth embodiments, although applications to n-type channel transistors were described, the present invention can also be applied to p-channel transistors.

Obviously many modifications and variations of the present invention are possible in the light of the above teachings. It is therefore to be understood that within the scope of the appended claims the invention maybe practiced otherwise than as specifically described.

The entire disclosure of a Japanese Patent Application No. 2006-231124, filed on Aug. 28, 2006 including specification, claims, drawings and summary, on which the Convention priority of the present application is based, are incorporated herein by reference in its entirety.

What is claimed is:

1. An insulated gate semiconductor device comprising:
a semiconductor substrate of a first conductivity type having a first major surface and a second major surface,
a first semiconductor layer of a second conductivity type provided on the first major surface of the semiconductor substrate in the vicinity of at least one first region of the semiconductor substrate and at least one second region of the semiconductor substrate adjacent to the first region,
a plurality of first trenches provided in the first region and penetrating the first semiconductor layer from the first major surface of the semiconductor substrate, a second semiconductor layer of the first conductivity type selectively provided in the vicinity of the plurality of first trenches on the first major surface of the semiconductor substrate and in the first region, an insulating film coating the inner surfaces of the plurality of first trenches, a conductive film buried in the first trenches through the insulating film, a first major electrode provided on the first semiconductor layer and the second semiconductor layer, and electrically connected to the first semiconductor layer, an entire third semiconductor layer of the second conductivity type provided on the second major surface of the semiconductor substrate and aligned with the first region, a fourth semiconductor layer of the first conductivity type provided on the second major surface of the semiconductor substrate, and a second major electrode coating the third semiconductor layer and the fourth semiconductor layer, and provided on the second major surface of the semiconductor substrate.

2. The insulated gate semiconductor device according to claim 1, further comprising:

a plurality of second trenches provided in the second region and penetrating the first semiconductor layer from the first major surface of the semiconductor substrate, an insulating film coating the inner surfaces of the plurality of second trenches, and a conductive film buried in the second trenches through the insulating film.

3. The insulated gate semiconductor device according to claim 1, wherein the width of the first region is larger than the width of the second region.

4. The insulated gate semiconductor device according to claim 2, wherein the distance between each of the plurality of first trenches is not more than 10 µm, and the distance between each of the plurality of second trenches is not more than 10 µm.

5. The insulated gate semiconductor device according to claim 3, wherein the width of the first region and the width of the second region is not less than 50 µm.

6. The insulated gate semiconductor device according to claim 1, further comprising:

a fifth semiconductor layer of the first conductivity type contacting the first semiconductor layer on a side of the first semiconductor layer other than a side of the first semiconductor layer on the first major surface of the semiconductor substrate, and having a higher impurity concentration than an impurity concentration of the semiconductor substrate.

7. The insulated gate semiconductor device according to claim 1, wherein the third semiconductor layer is provided on the second major surface side of the semiconductor substrate in a location facing the second semiconductor layer of the first region, and the fourth semiconductor layer is provided on the second major surface side of the semiconductor substrate in a location facing the first semiconductor layer of the second region.

8. The insulated gate semiconductor device according to claim 1, wherein the impurity concentration of the first semiconductor layer provided in the second region is lower than the impurity concentration of the first semiconductor layer provided in the first region.

9. The insulated gate semiconductor device according to claim 2, wherein the plurality of first trenches in the first region are evenly spaced at a first distance, the plurality of second trenches in the second region are evenly spaced at a second distance, and the second distance is smaller than the first distance.

* * * * *